US008525131B2

(12) United States Patent
Kim et al.

(10) Patent No.: US 8,525,131 B2
(45) Date of Patent: Sep. 3, 2013

(54) PHOSPHORESCENT ORGANIC COMPOUNDS

(75) Inventors: Jinsang Kim, Ann Arbor, MI (US);
Onas Bolton, Dearborn, MI (US);
Kangwon Lee, Ann Arbor, MI (US);
Eun Jeong Jeong, Ann Arbor, MI (US);
Bong-Gi Kim, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 13/511,882

(22) PCT Filed: Nov. 24, 2010

(86) PCT No.: PCT/US2010/058042
§ 371 (c)(1),
(2), (4) Date: May 24, 2012

(87) PCT Pub. No.: WO2011/066415
PCT Pub. Date: Jun. 3, 2011

(65) Prior Publication Data
US 2012/0248337 A1 Oct. 4, 2012

Related U.S. Application Data

(60) Provisional application No. 61/264,489, filed on Nov. 25, 2009, provisional application No. 61/362,071, filed on Jul. 7, 2010.

(51) Int. Cl.
G01J 1/58 (2006.01)

(52) U.S. Cl.
USPC .................................... 250/459.1; 250/458.1

(58) Field of Classification Search
USPC ....................................................... 250/459.1
See application file for complete search history.

(56) References Cited

U.S. PATENT DOCUMENTS

| 5,659,084 | A | 8/1997 | Gombatz et al. |
| 6,903,239 | B2 | 6/2005 | Peilstocker et al. |
| 2002/0038055 | A1 | 3/2002 | Baumann et al. |

FOREIGN PATENT DOCUMENTS

JP 2003-073311 3/2003

OTHER PUBLICATIONS

International Search Report and Written Opinion of the ISA, ISA/KR, Seo-gu, Daejeon; mailed Aug. 17, 2011.

Primary Examiner — Marcus Taningco
(74) Attorney, Agent, or Firm — Harness, Dickey & Pierce, P.L.C.

(57) ABSTRACT

Compositions providing metal-independent phosphorescence due to a directed heavy atom effect are provided. Methods of providing a phosphorescent composition are also provided where a directed heavy atom effect is maintained to cause the composition to be phosphorescent. Manufacture of phosphorescent compositions using intermolecular and intramolecular directed heavy atom effects are disclosed.

20 Claims, 21 Drawing Sheets

8-Bromobiphenylene-1-carboxaldehyde

PHOSPHORESCENT ORGANIC COMPOUNDS

CROSS-REFERENCE TO RELATED APPLICATIONS

Figure 1:
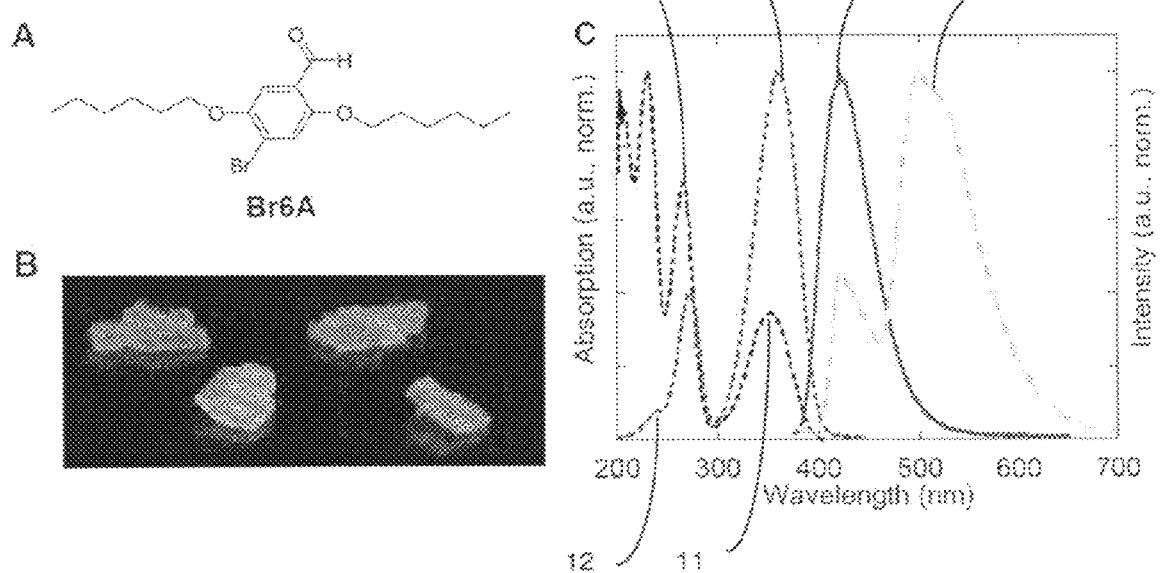

This application is a 371 U.S. National Stage of International Application No. PCT/US2010/058042, filed Nov. 24, 2010, which claims the benefit of U.S. Provisional Application Nos. 61/264,489 filed on Nov. 25, 2009 and 61/362,071 filed on Jul. 7, 2010. The entire disclosures of the above applications are incorporated herein by reference.

GOVERNMENT RIGHTS

This invention was made with U.S. Government support under Grant Nos. BES 0428010 and DMR 0644864 awarded by the National Science Foundation. The U.S. Government has certain rights in the invention.

FIELD

The present disclosure relates to phosphorescent materials and, more particularly, to high efficiency metal-independent phosphorescence from organic compounds using a directed heavy atom effect.

INTRODUCTION

Phosphorescent materials are enhancing and broadening the usefulness of organic compounds in a wide variety of applications. They can increase organic light emitting diode efficiencies three-to-four fold, enhance organic photovoltaics, and can provide unique sensitivity for chemical and cancer detection. Unfortunately, metal-free organics are intrinsically incapable of efficient phosphorescence, which can restrict these fields to a relatively limited family of organometallics when designing new materials.

SUMMARY

The present technology includes compositions, methods, systems, and articles of manufacture that relate to organic materials that exhibit metal-independent phosphorescence.

In some embodiments, a composition is provided that is capable of generating metal-independent phosphorescence. The composition includes a first portion having a carbonyl group bonded to an aromatic group or an aromatic group having extended π-conjugation, a second portion having a halogen atom bonded to an aromatic group or an aromatic group having extended π-conjugation, and a non-covalent interaction between the oxygen of the carbonyl group and the halogen atom via a directed heavy atom effect, wherein the distance between the oxygen of the carbonyl group and the halogen atom is less than the van der Waals radii of the oxygen of the carbonyl group and the halogen atom. The composition can exhibit a quantum yield from about 1% to about 68%. The composition can also be crystalline or the second portion can be comprised by a compound that is crystalline at room temperature. The composition can further comprise a polymer, such as poly(methylacrylate), poly(methylmethacrylate), poly(styrene), or poly(α-methyl styrene). The aromatic aldehyde having halogen can be armophous materials as well.

In some cases, the first portion and the second portion of the composition are comprised by a single compound where the composition further includes at least two molecules of the compound. For example, the compound can comprise formula I:

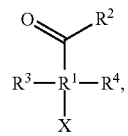

wherein $R^1$ is an aromatic group or an aromatic group having extended π-conjugation, $R^2$ is hydrogen or an alkyl group, $R^3$ and $R^4$ are independently hydrogen, alkyl, alkoxy, or alkylsulfane groups optionally substituted with one or more heteroatoms, and X is a halogen atom. In some embodiments, the compound of formula I includes where $R^1$ is a phenyl or napthyl group, $R^2$ is hydrogen, and $R^3$ and $R^4$ are independently heptyl, hexyloxy, hexylsulfane, or 2-ethylhexyl groups, and X is a bromine, chlorine, or iodine atom. Particular embodiments of formula I include, for example, 4-bromo-2,5-diheptylbenzaldehyde; 2,5-dihexyloxy-4-bromobenzaldehyde; 4-bromo-2,5-bis(hexylthio)benzaldehyde; 5-bromo-2,6-bis(hexyloxy)-1-naphthaldehyde, and 4-bromo-2,5-di ((2-ethylhexyl)oxy)benzaldehyde.

In some embodiments where the composition includes a compound of formula I, the composition can further comprise a compound of formula II:

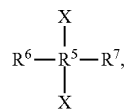

where $R^5$ is an aromatic group or an aromatic group having extended π-conjugation, $R^6$ and $R^7$ are independently hydrogen, alkyl, alkoxy, or alkylsulfane groups optionally substituted with one or more heteroatoms, and X is a halogen atom. In some embodiments, $R^5$ is a phenyl or napthyl group, $R^6$ and $R^7$ are independently heptyl, hexyloxy, hexylsulfane, or 2-ethylhexyl groups, and X is a bromine, chlorine, or iodine atom. Particular embodiments of formula II include, for example, 1,4-dibromo-2,5-diheptylbenzene; 2,5-dihexyloxy-1,4-dibromobenzene; (2,5-dibromo-1,4-phenylene)bis (hexylsulfane); and 1,5-dibromo-2,6-bis(hexyloxy)naphthalene.

In some embodiments, the composition includes where the first portion and the second portion are comprised by a single compound and the non-covalent interaction between the carbonyl oxygen and the halogen atom is via an intramolecular directed heavy atom effect. Where a single compound comprises the first and second portions, embodiments of the compound can comprise formula III:

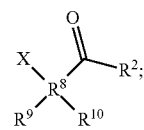

where $R^2$ is hydrogen or an alkyl group, $R^8$ is an aromatic group or an aromatic group having extended π-conjugation, $R^9$ and $R^{10}$ are independently hydrogen, alkyl, alkoxy, or alkylsulfane groups optionally substituted with one or more heteroatoms, and X is a halogen atom. In some embodiments, $R^2$ is hydrogen, $R^8$ is a biphenylene, fluorene, 1,2-diphenylethene, or 1,2-distyrylbenzene group, $R^9$ and $R^{10}$ are ethyloxy groups, and X is a bromine, chlorine, or iodine atom. Particular embodiments of formula III include, for example, 8-bromo-3,6-diethoxybiphenylene-1-carbaldehyde; 4,5,8-tribromo-3,6-diethoxybiphenylene-1-carbaldehyde; 5-bromo-2,7-diethoxy-9H-fluorene-4-carbaldehyde; 2-(2-bromo-5-ethoxystyryl)-4-ethoxybenzaldehyde; 2-(2-bromo-4-ethoxystyryl)-5-ethoxybenzaldehyde; and 2-(2-(2-bromostyryl)-4,5-diethoxystyryl)benzaldehyde.

In some embodiments, an article of manufacture is provided that comprises a composition capable of generating metal-independent phosphorescence, as described herein. The article of manufacture can include a light emitting diode, organic photovoltaic material, flexible lighting display, solid-state lighting, polarized light emitting device, quantum dot, thin-film transistor, or phosphorescent nanowire.

In some embodiments, a method of providing phosphorescence is provided. The method includes providing a composition capable of generating metal-independent phosphorescence, as described herein. The composition is excited with a first light while the distance between the oxygen of the carbonyl group and the halogen atom is maintained at less than their van der Waals distance so that the composition absorbs at least a portion of the first light and emits a second light. In various embodiments, the distance between the oxygen of the carbonyl group and the halogen atom is maintained at less than their van der Waals distance by crystallizing at least a portion of the composition, entangling the composition with a polymer, and/or providing the first portion and the second portion in a single compound so that the non-covalent interaction between the carbonyl oxygen and the halogen atom is via an intramolecular directed heavy atom effect.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1. Photophysical properties of Br6A. (a) Chemical structure of Br6A. (b) Photograph of Br6A in methanol solution (left) and crystals of Br6A (right) irradiated with 365 nm UV light. (c) Normalized UV Absorption of Br6A in chloroform (11), PL Excitation of Br6A in chloroform (12), PL Emission (fluorescence) of Br6A in chloroform (13), and PL Emission (mixed weak fluorescence and strong phosphoresce) of pure crystals of Br6A (14) at room temperature.

Figure 2:
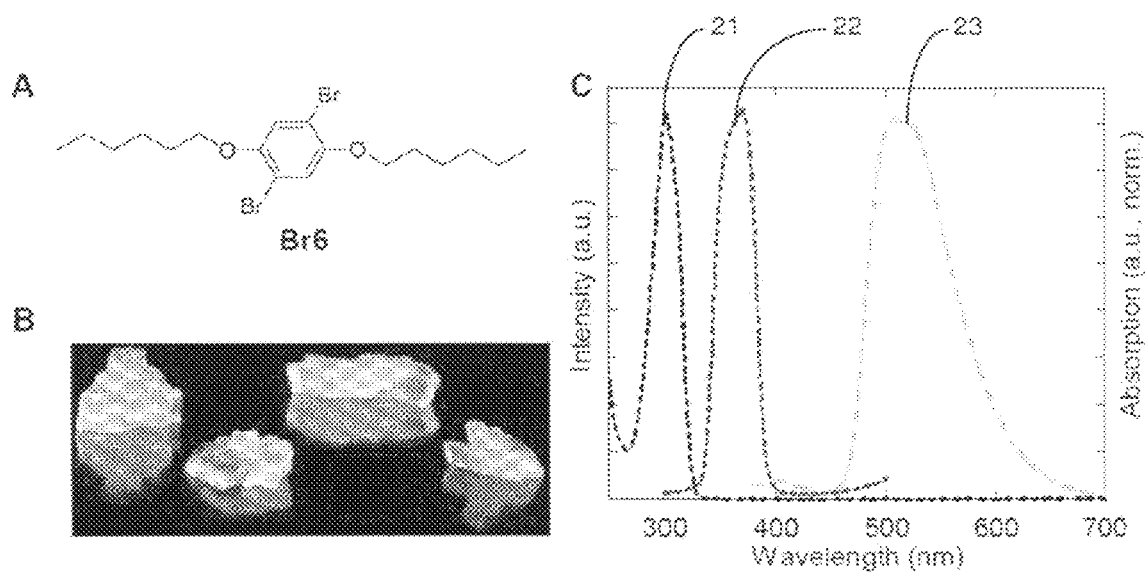

FIG. 2. Photophysical properties of cocrystals of Br6A in Br6. (a) Chemical structure of Br6. (b) Photograph of cocrystals grown from slow evaporation of a hexane solution containing a 0.001 wt % mix of BrA6/Br6 irradiated with 365 nm UV light. (c) Normalized UV Absorption (21), PL Excitation (22), and PL Emission (23) of the crystals shown in part b. Absorption is primarily from Br6, which constitutes the vast majority of the crystal.

Figure 3:
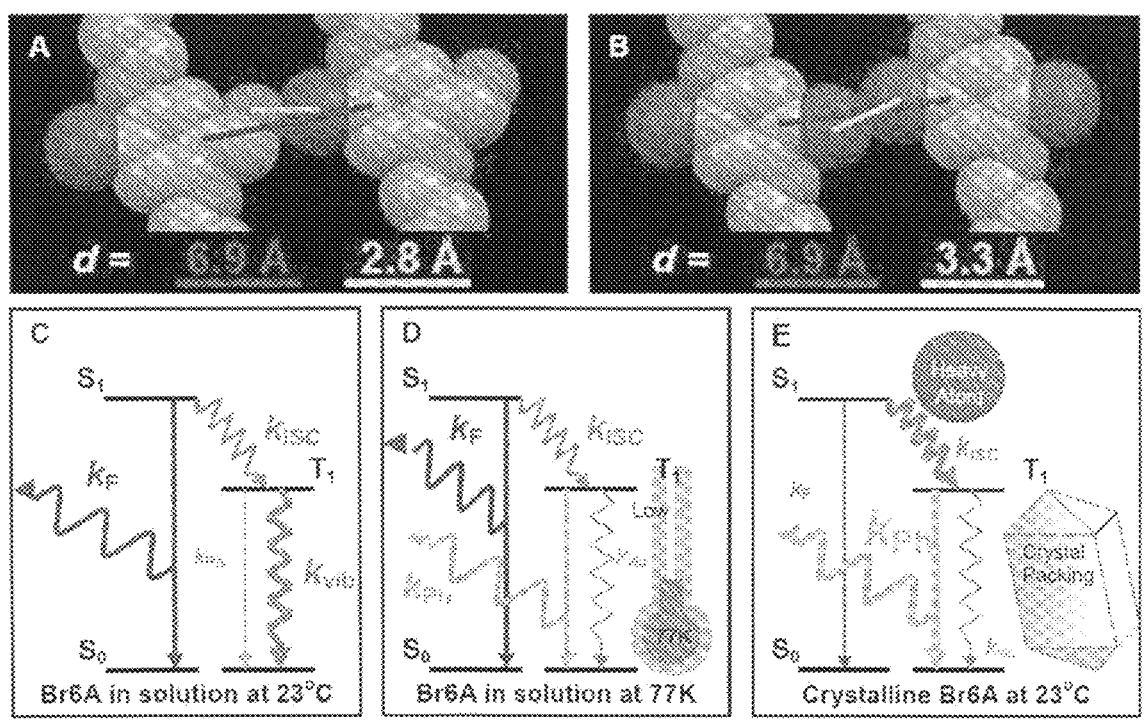

FIG. 3. (a) Space-filling diagram of crystals of Br6A highlighting the intermolecular contact between the carbonyl oxygen and bromine defining the halogen bond. Nuclear distances are given highlighting the close contact of the two atoms. (b) Space-filling diagram of crystals of Br6 highlighting the halogen-halogen interaction between neighboring molecules. Note aromatic ring distances of both crystals are identical at 6.9 Å, by which we expect Br6A includes by substitution into Br6 with O˙˙Br distances comparable to those in Br6A crystals. (c) Simplified energy diagram of Br6A in solution at 23° C. where triplets generated get annihilated by vibrational dissipation, and only sinlget emission is detected. (d) Br6A at low temperature where triplets formed decay emissively as vibrational dissipation is prevented due to thermal limitation. (e) Crystalline Br6A or Br6A/Br6 at room temperature where the heavy atom effect enhances triplet formation beyond intrinsic rates, halogen bonding prevents vibration at the carbonyl, and phosphorescence dominates.

Figure 4:
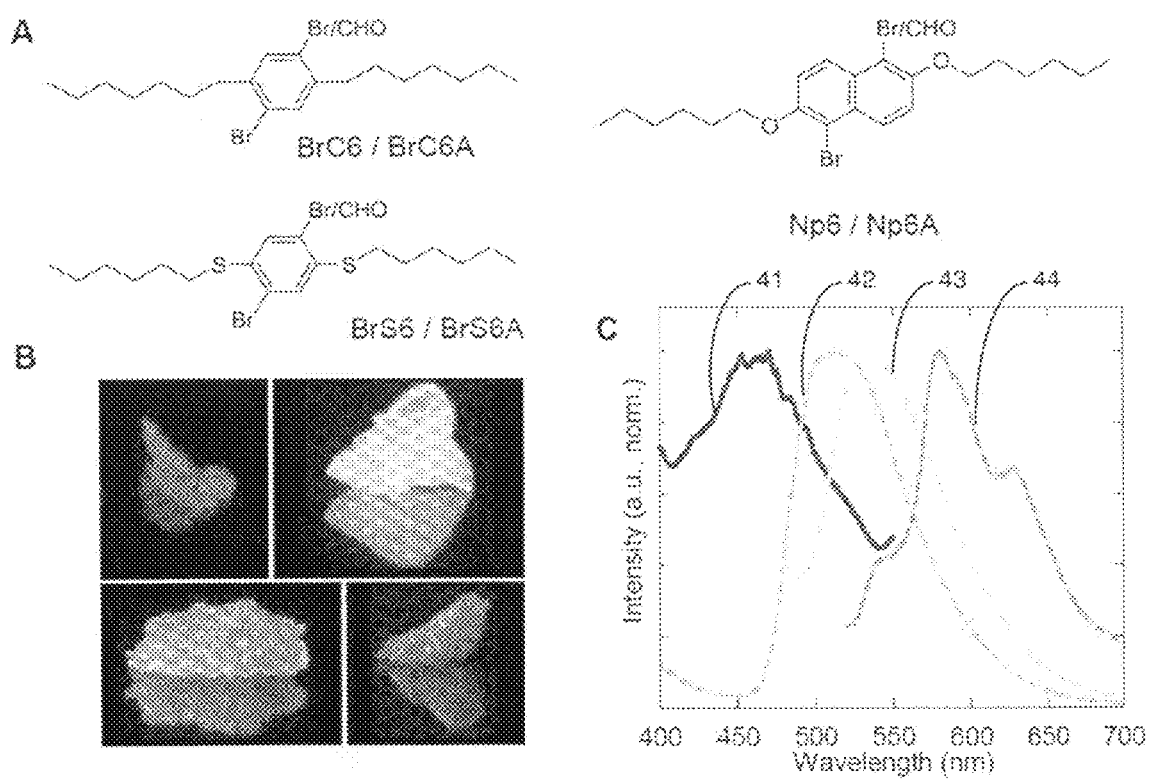

FIG. 4. Photophysical properties of color-tuned aromatic aldehydes. (a) Structures of aldehydes designed to produce shifts in emission wavelength. (b) Photographs of BrC6A/BrC6, Br6A/Br6, Np6/Np6A, and BrS6A/BrS6 (clockwise from top-left) cocrystals each containing 1 wt % aldehyde and 99 wt % analogous dibromo compound. Crystals are shown under 365 nm UV Light. (c) PL emission of BrC6A (41), Br6A (42, for reference), BrS6A (43) and Np6A (44) crystals shown in b.

Figure 5:
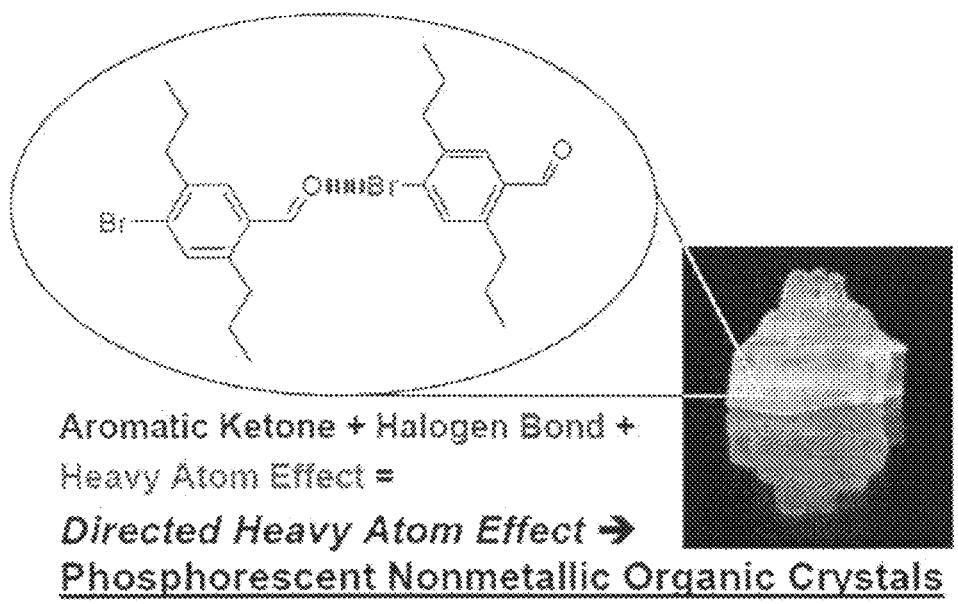

FIG. 5. Schematic showing the aromatic ketone and halogen bond contributions to the heavy atom effect resulting in phosphorescent non-metallic organic crystals.

Figure 6:
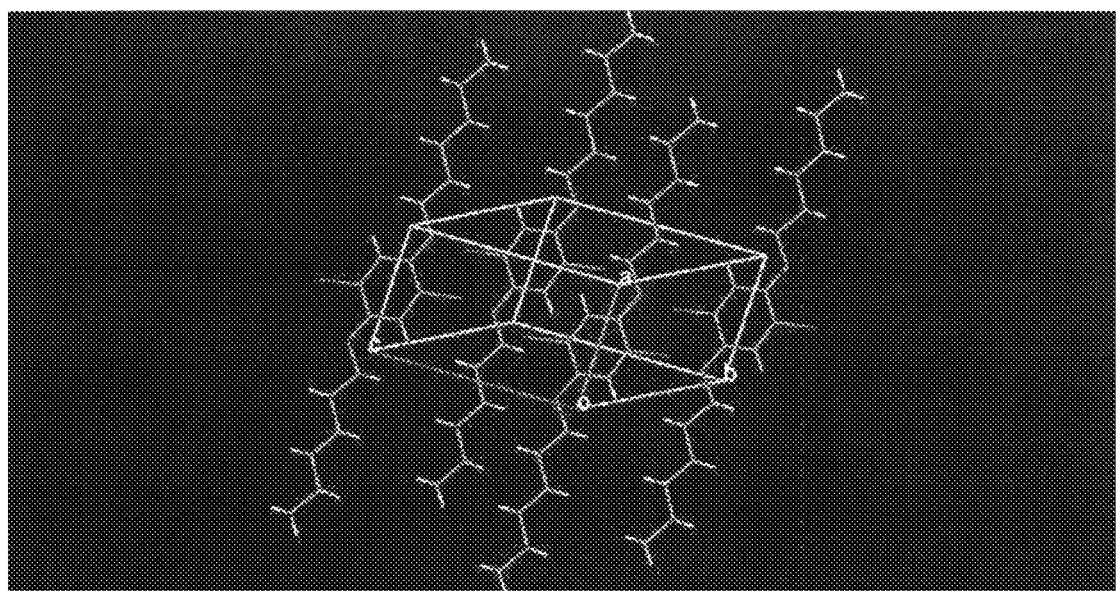

FIG. 6. Crystal unit cell of Br6.

Figure 7:
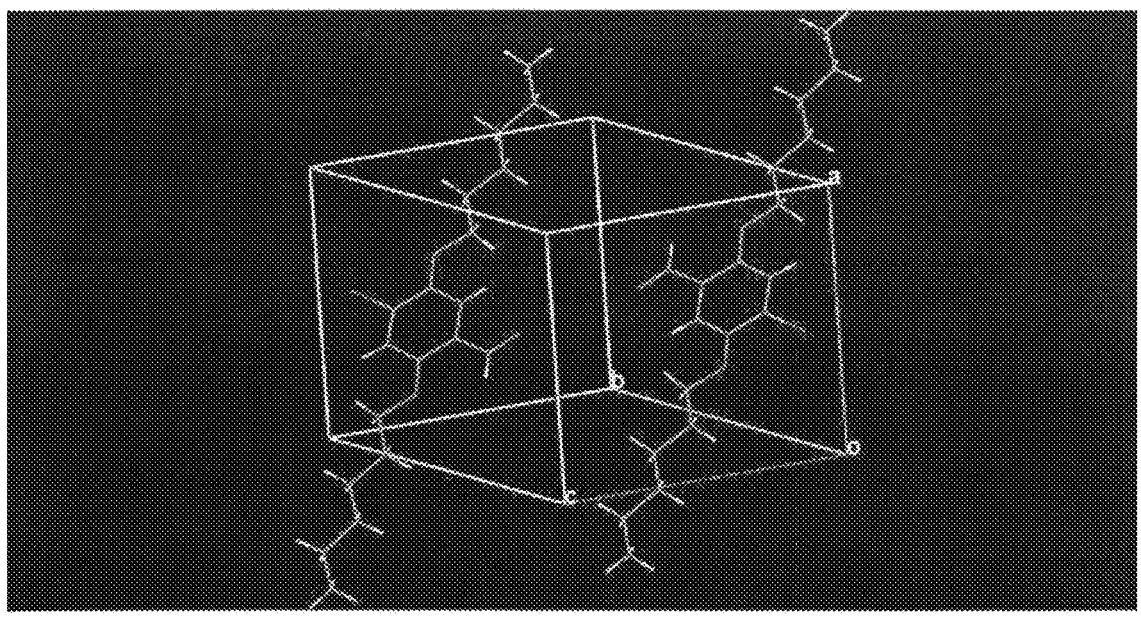

FIG. 7. Crystal unit cell of Br6A.

Figure 8:
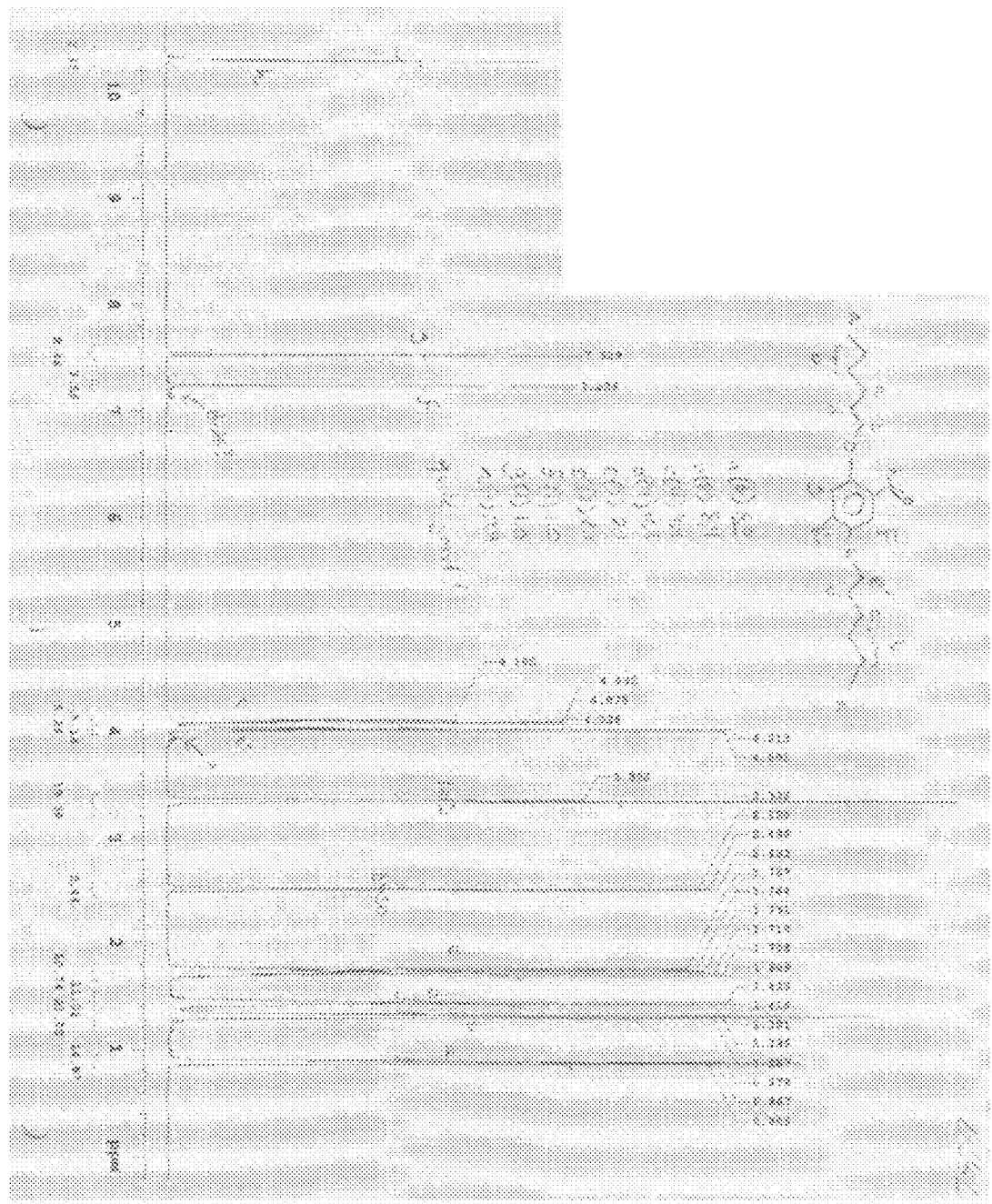

FIG. 8. $^1$H NMR spectrum for 4-bromo-2,5-bis(hexyloxy) benzaldehyde, where hydrogen positions on the inset compound structure and the respective spectrum peaks are labeled "a" through "h."

Figure 9:
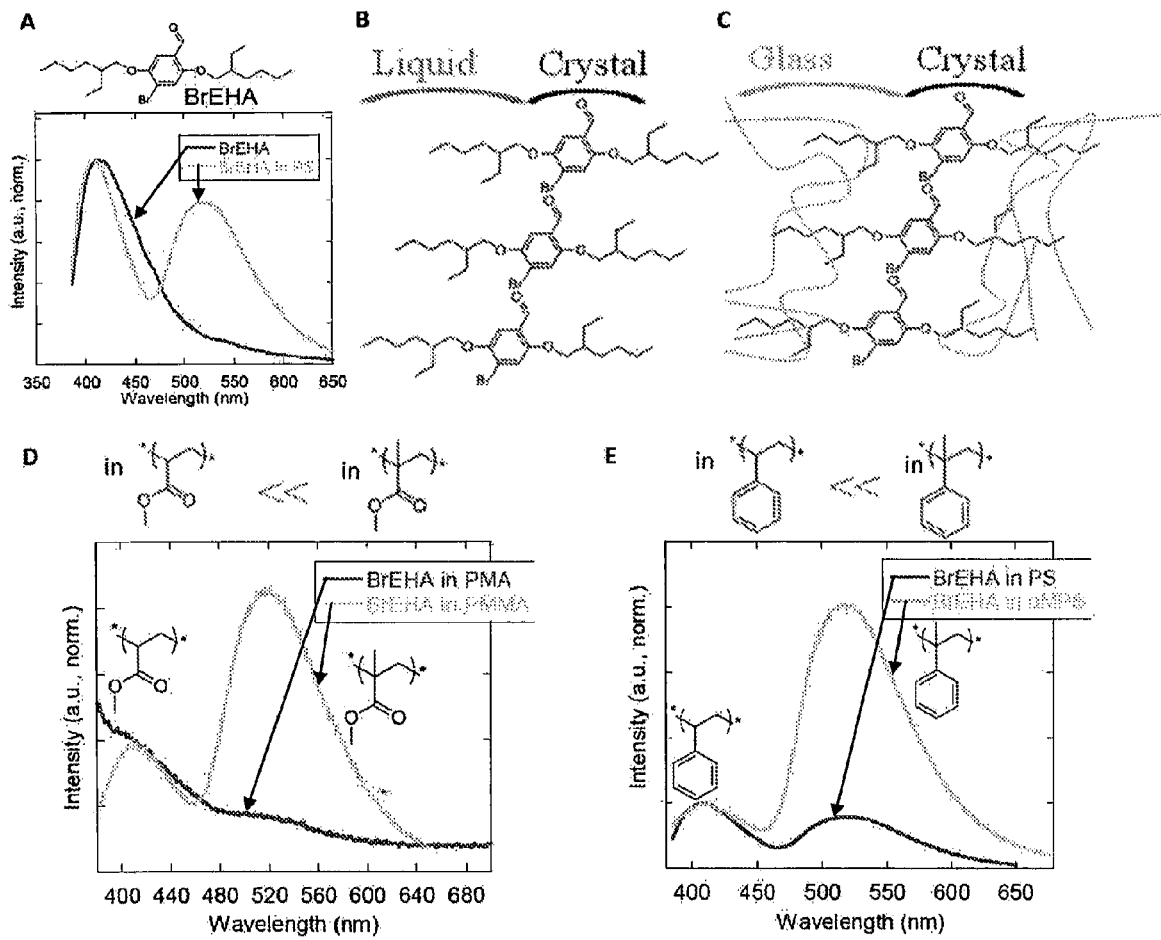

FIG. 9. A. Chemical structure of BrEHA and its emission spectrum in a liquid at room temperature and in polystyrene. B. Schematic illustration of the liquid state of BrEHA at room temperature. The ethylhexyl side chain does not pack rendering liquid-like property to BrEHA. C. Schematic illustration of entanglement of BrEHA with glassy polymers. D. BrEHA is mainly fluorescent in PMA but becomes phosphorescent in the branched PMMA. E. BrEHA is fluorescent/phorphorescent in PS but becomes mainly phosphorescent in the branched polyα-methyl styrene.

Figure 10:
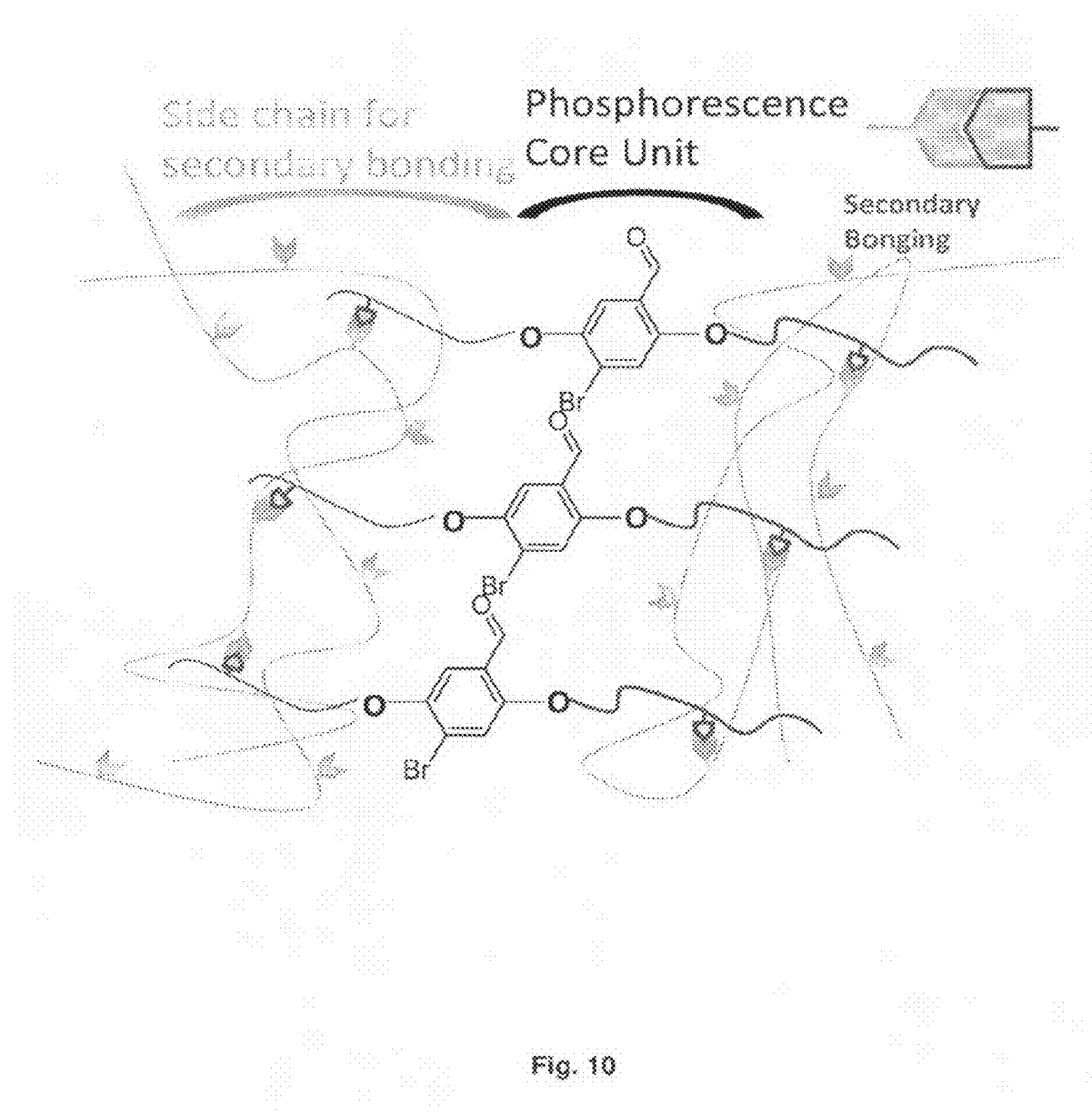

FIG. 10. Schematic of enhanced phosphorescence emission by means of secondary bonding.

Figure 11:
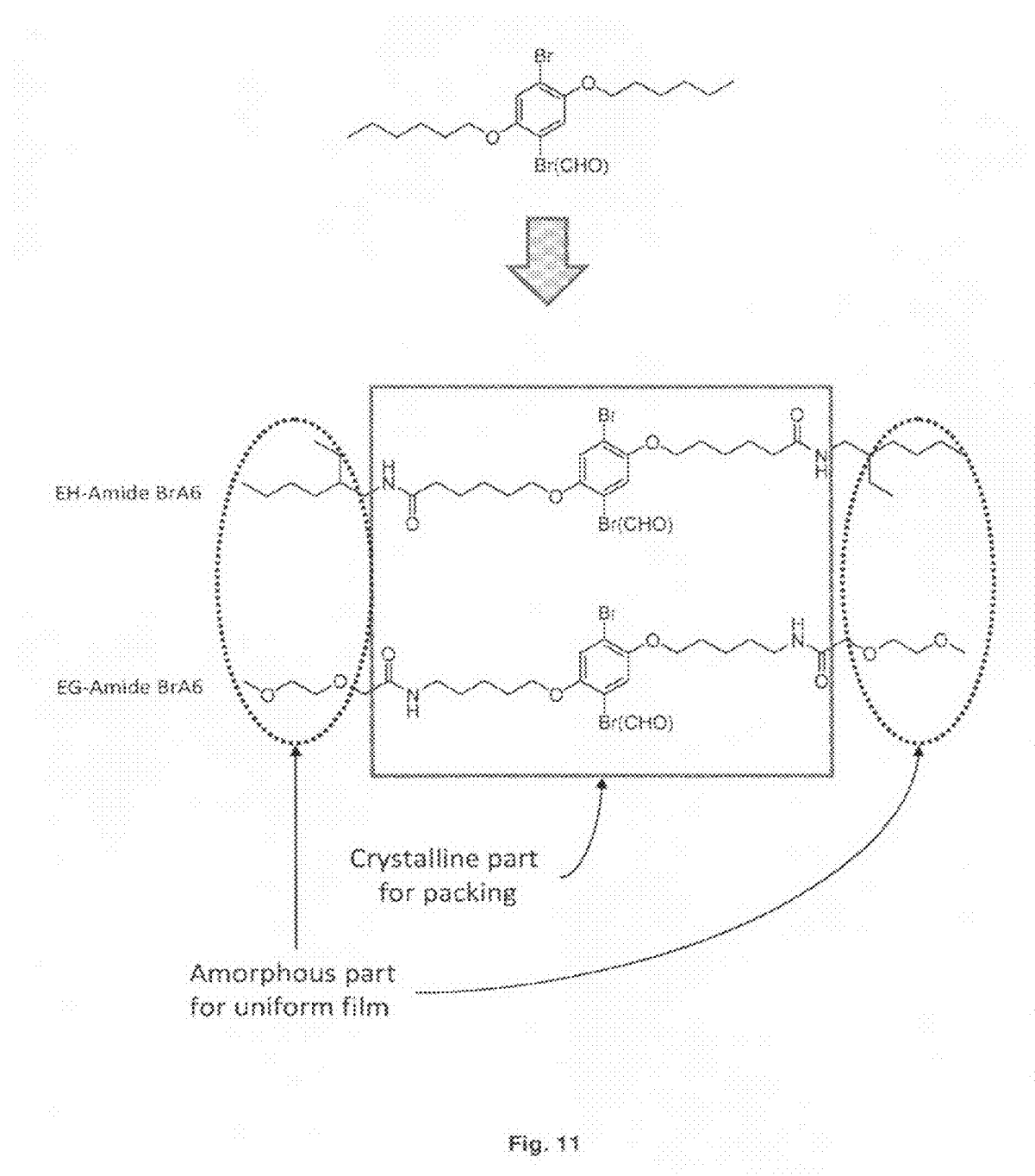

FIG. 11. Examples of compounds having an amorphous portion and a crystalline portion, where the depicted compounds have either a halogen atom bonded to an aromatic group or a carbonyl group bonded to an aromatic group as depicted by "Br(CHO)."

Figure 12:
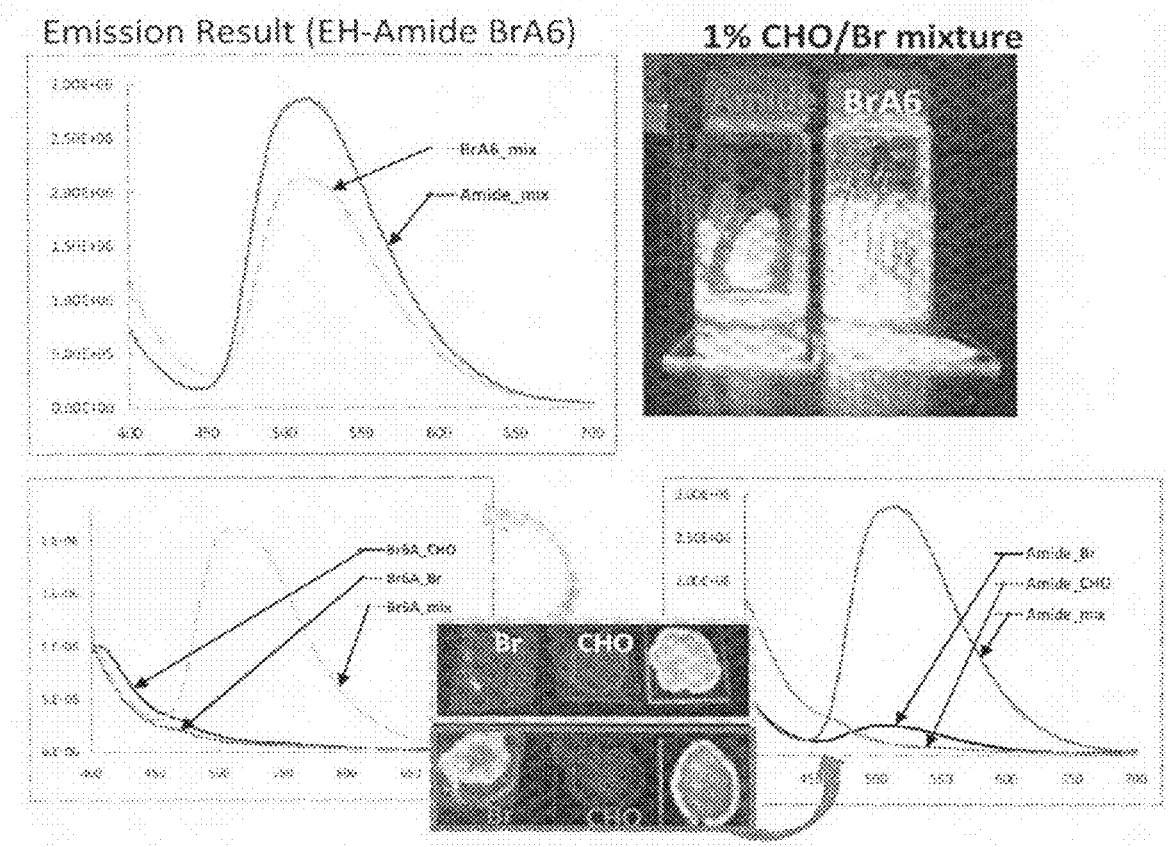

FIG. 12. Phosphorescent emission of compounds having a carbonyl bonded to an aromatic group and an amorphous portion (e.g., Br6A CHO and Amide CHO), compounds having a halogen bonded to an aromatic group and an amorphous portion (e.g., BR6A Br and Amide Br), and mixtures of the two (e.g., Br6A CHO+BR6A Br and Amide CHO+Amide Br).

Figure 13:
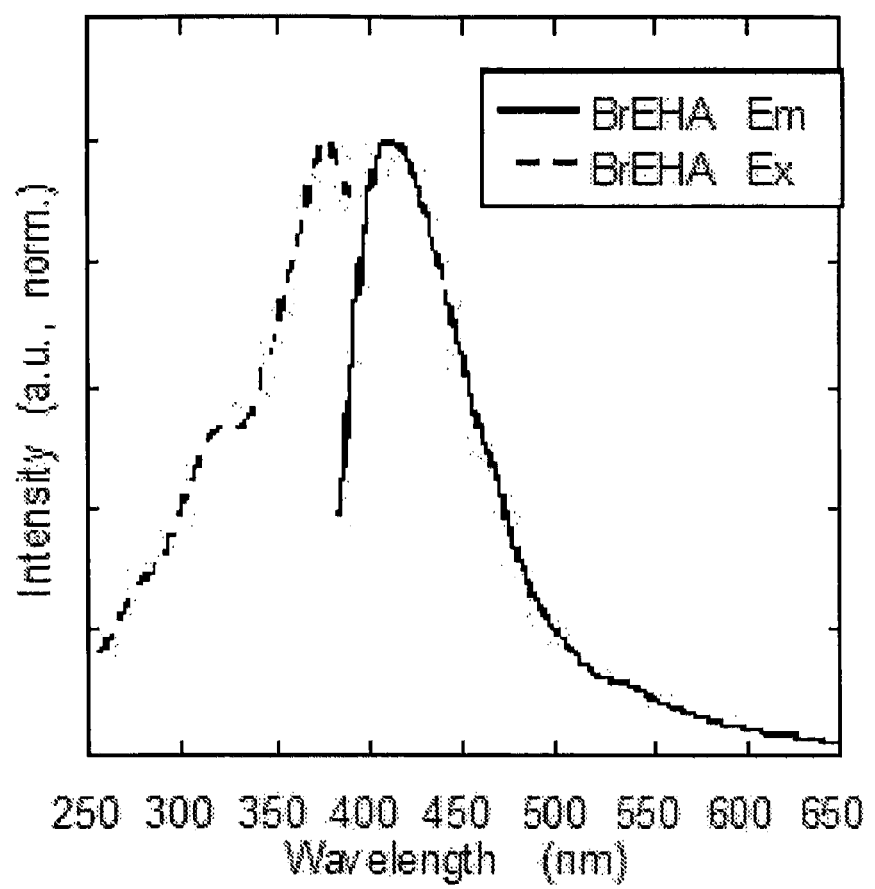

FIG. 13. Photoluminescence (PL) emission and excitation of BrEHA liquid.

Figure 14:
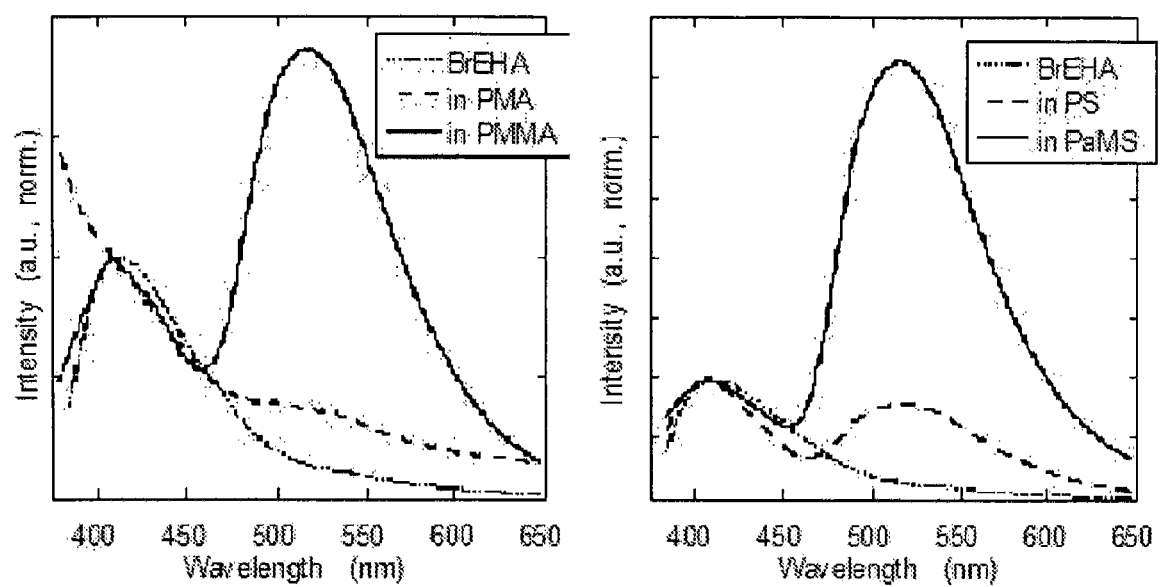

FIG. 14. PL emission spectra of BrEHA embedded in various polymers.

Figure 15:
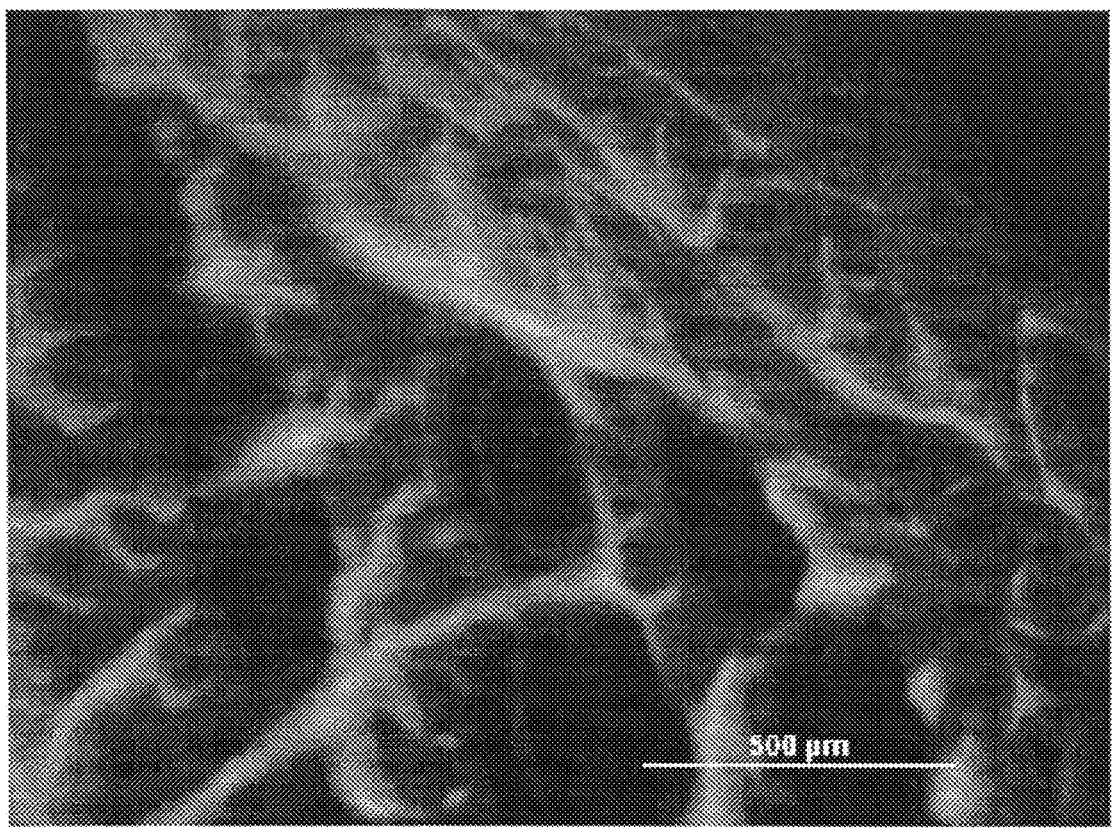

FIG. 15. Optical micrograph of BrEHA/PMMA film.

Figure 16:
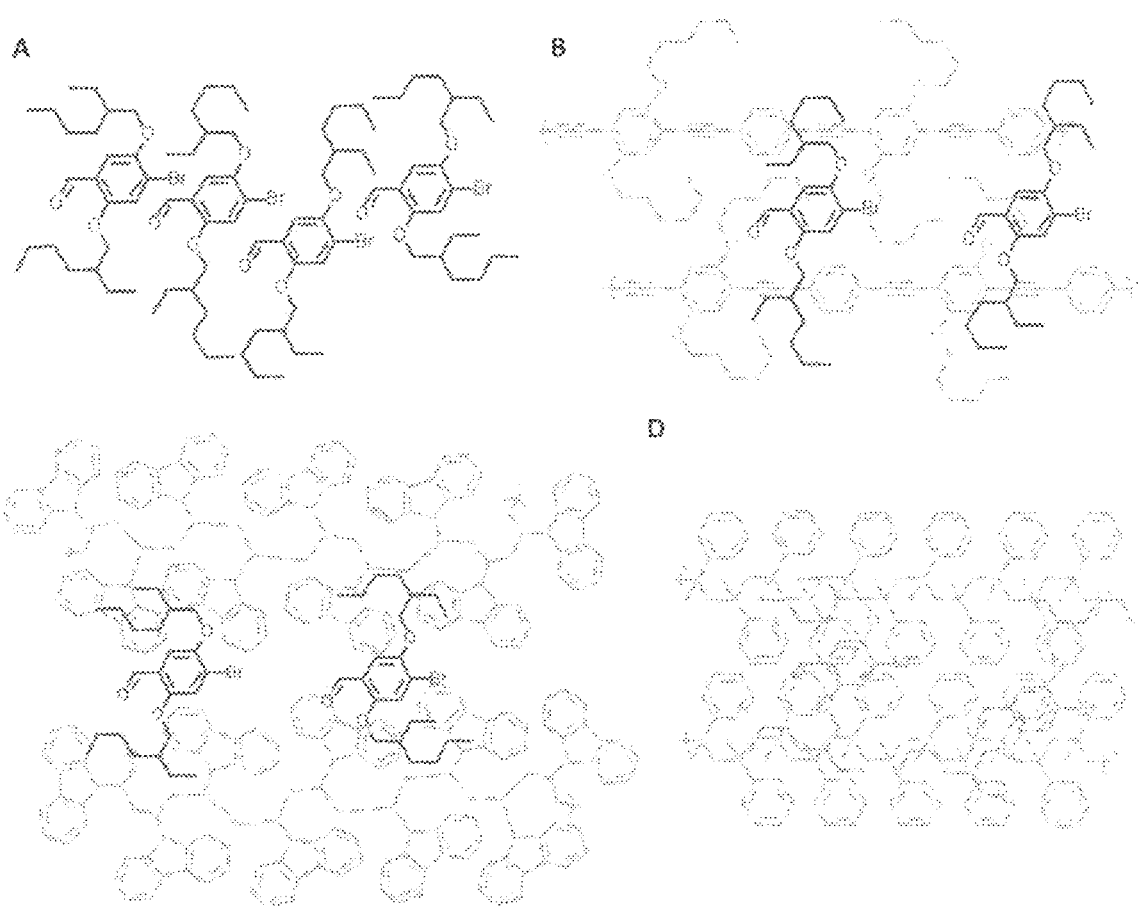

FIG. 16. Schematic illustrating the idea of polymer entanglement. (A) BrEHA liquid has great vibrational freedom so triplets relax non-emissively. (B) PPE has a rigid backbone that does not entangle the alkyl substitutents of BrEHA. Triplets relax by vibration here as well. (C) PVK has a flexible backbone, but its bulky pendants prevent BrEHA molecules from getting close enough to become entangled. (D) PaMS has a flexible, entangling backbone and small pendants. BrEHA mixes well and the glassy polymer prevents vibrational freedoms. Triplets emit strong phorphorescence.

Figure 17:
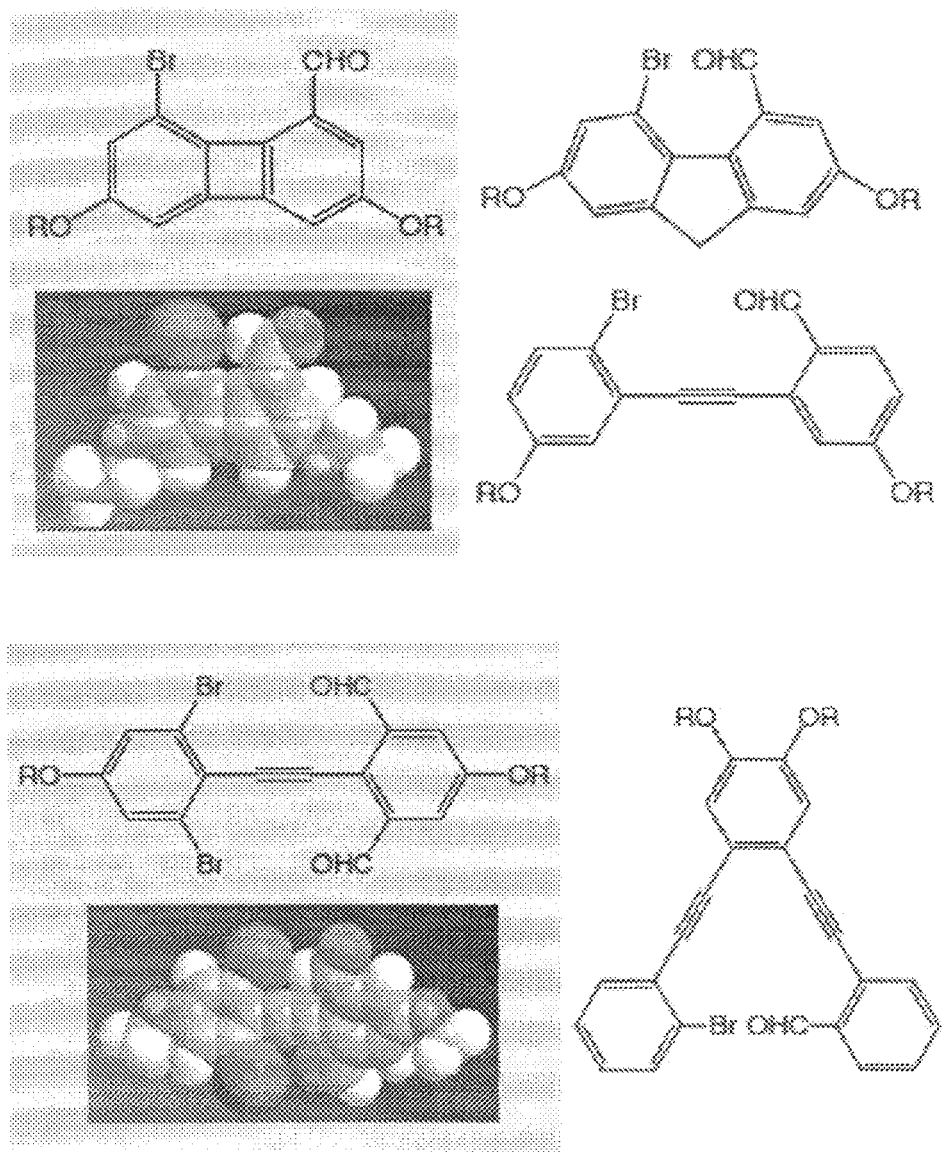

FIG. 17. Structures of various compounds showing intramolecular directed heavy atom effects.

Figure 18:
Figure 18:
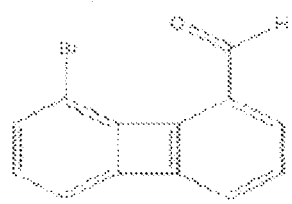
Figure 18:
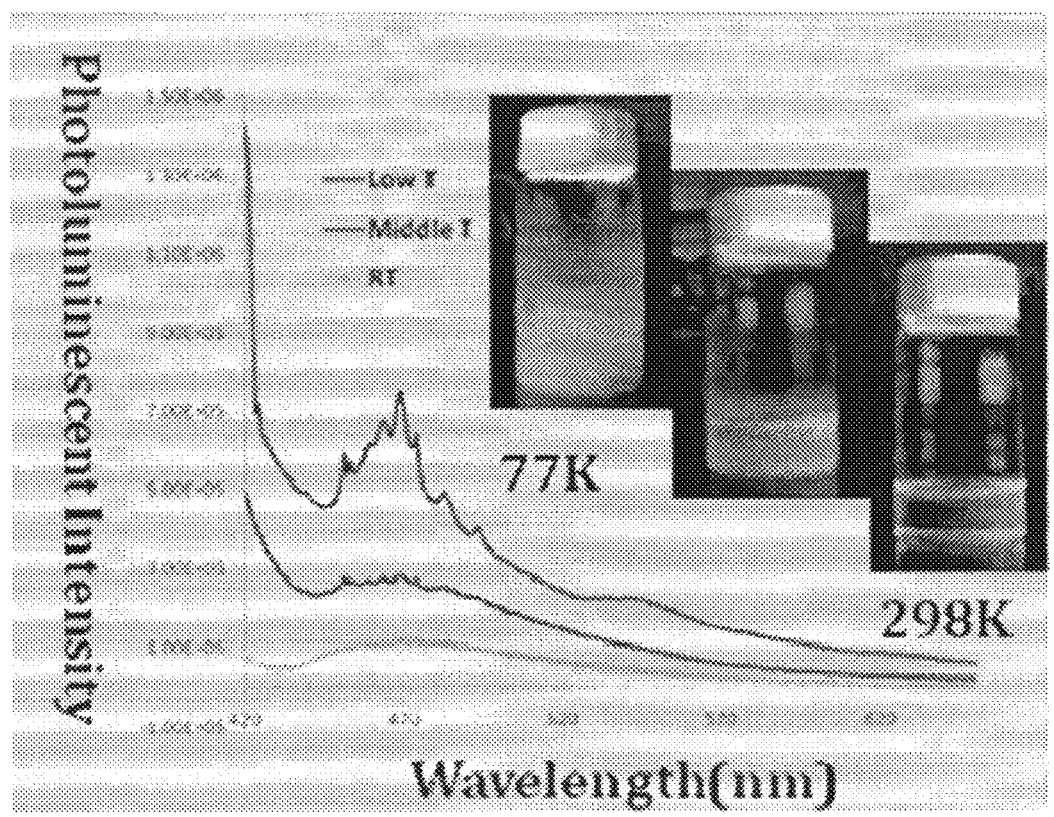

FIG. 18. Structure of 8-bromobipheylene-1-carboxaldehyde and a plot of its photoluminescence versus wavelength, where the inset shows photographs of a vial of the compound at different temperatures.

Figure 19:
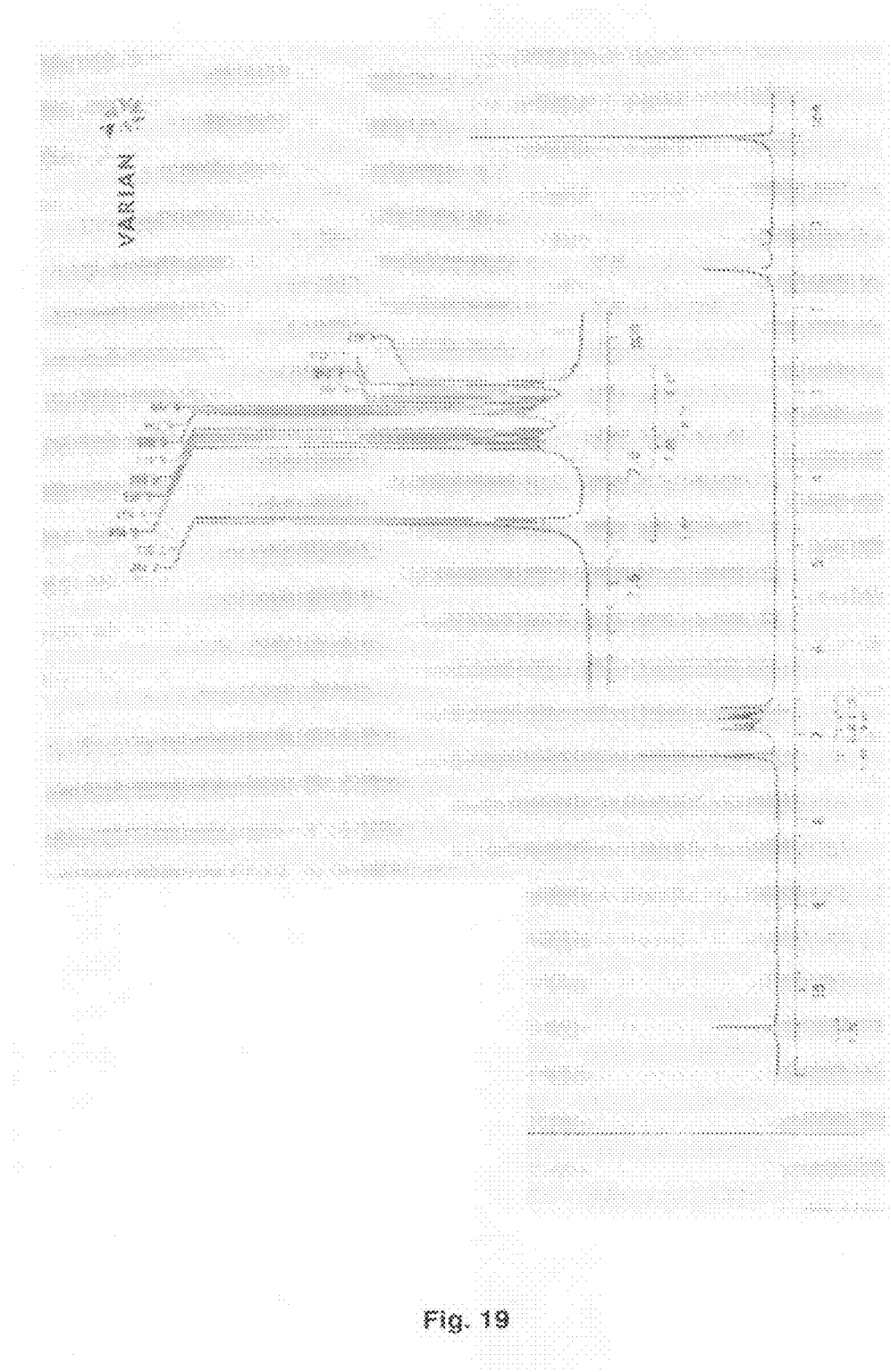

FIG. 19. $^1$H NMR spectrum of 8-bromobipheylene-1-carboxaldehyde.

Figure 20:
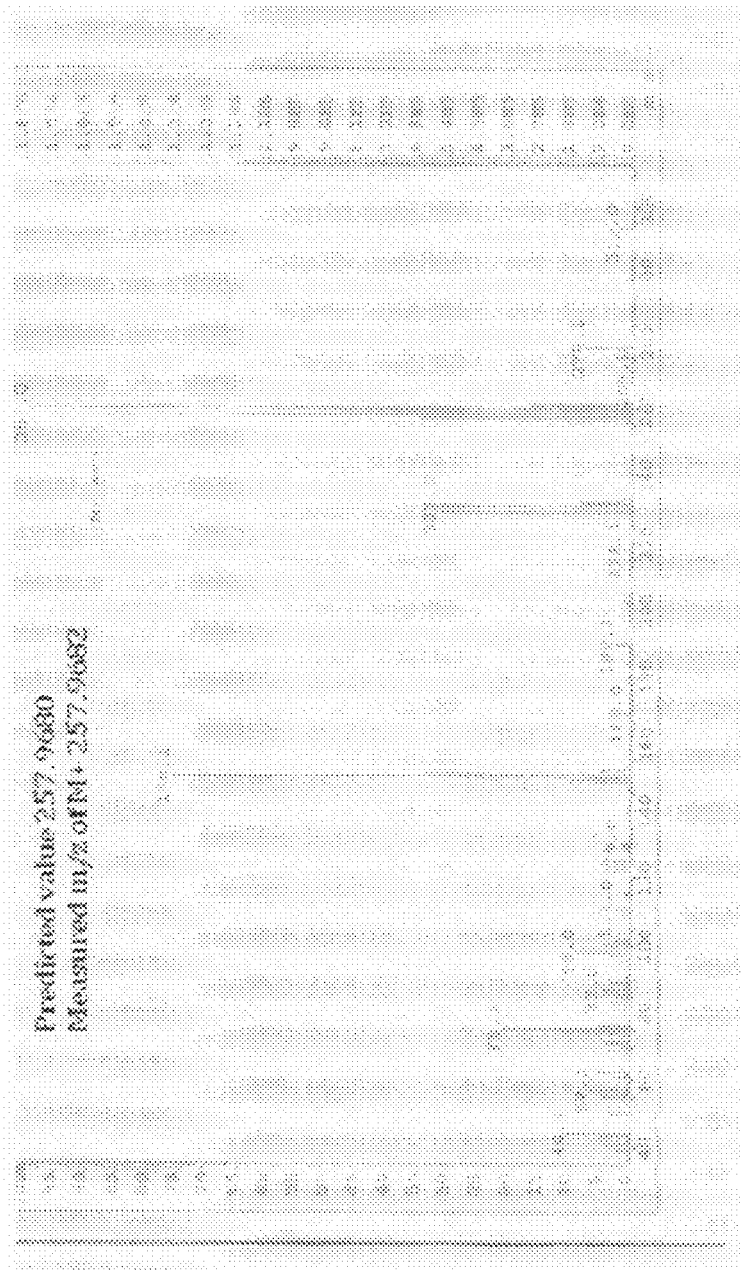

FIG. 20. Mass spectrum of 8-bromobipheylene-1-carboxaldehyde.

Figure 21:
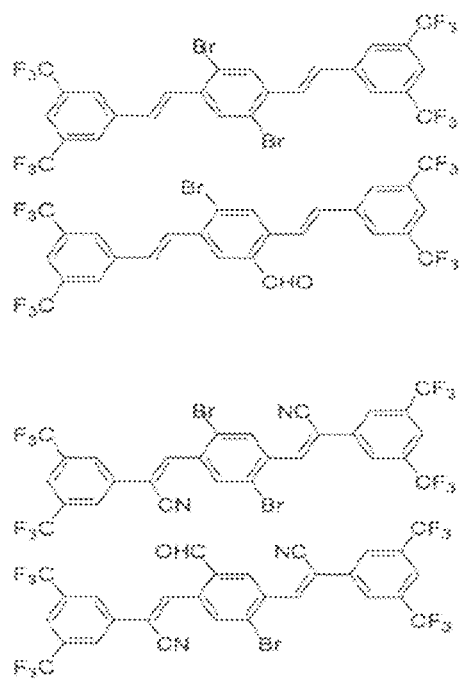
Figure 21:
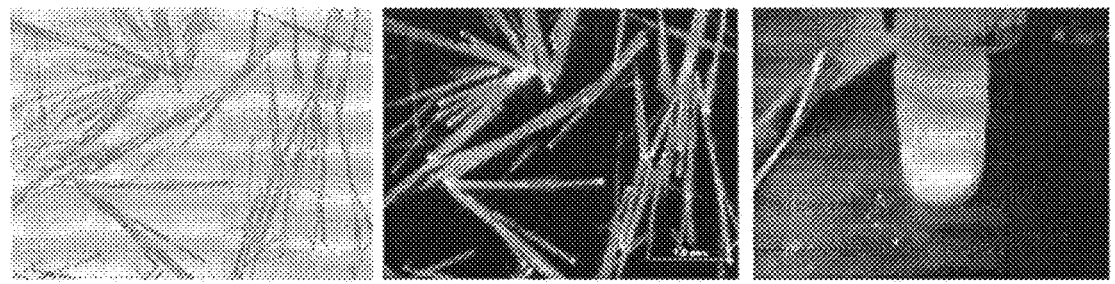
Figure 21:
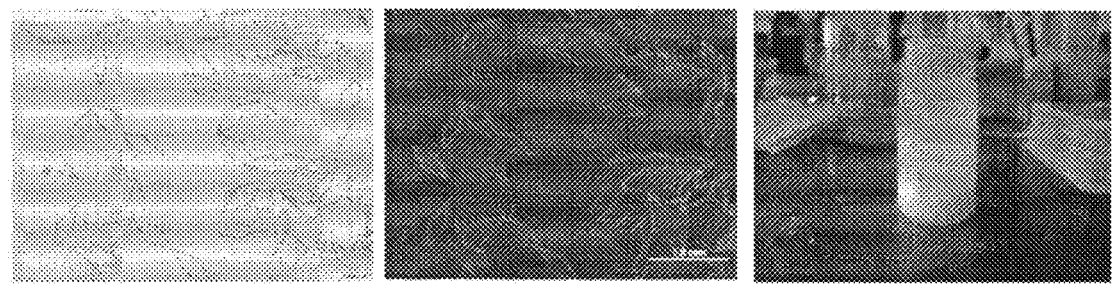

FIG. 21. Structures of various compounds useful as phosphorescent organic nanowires along with photomicrographs of such nanowires.

DETAILED DESCRIPTION

The following description of technology is merely exemplary in nature of the subject matter, manufacture, and use of one or more inventions, and is not intended to limit the scope, application, or uses of any specific invention claimed in this application or in such other applications as may be filed claiming priority to this application, or patents issuing therefrom. A non-limiting discussion of terms and phrases intended to aid understanding of the present technology is provided at the end of this Detailed Description.

The present technology includes a novel and versatile design principle to activate efficient metal-free phosphorescence in organic materials using a directed heavy atom effect. By designing chromophores that contain both aromatic aldehydes and halogens, these materials, such as crystals, can exhibit ambient photoluminescence. Phosphorescent quantum yields can be as high as about 68%, for example. Halogen bonding acts in these materials to direct the heavy atom halogen into noncovalent interactions with the carbonyl oxygen, enhancing spin-orbit coupling to promote bright phosphorescence. This design principle can be used to activate phosphorescence in a family of chromophores and can provide color-tuning emission from blue to orange. The directed heavy atom effect (DHAE) design principle allows organic phosphor design to include the broad class of nonmetallic organics and demonstrates a new, functional use for halogen bonding.

By "metal-independent phosphorescence," it is meant that the present compositions, compounds, and materials are phosphorescent or provide a portion of phosphorescence that is independent of any metal or organometallic portion of the composition, compound, or material. That is, the present compositions, compounds, and materials provide all or some of their phosphorescence based on the DHAE design principle described herein, where a heavy atom halogen interacts with a carbonyl oxygen. Accordingly, the present compositions, compounds, and materials may include a metal or an organometallic portion that also provides phosphorescence of they may be combined with metals or organometallic compounds or materials that independently provide phosphorescence, but such addition of a metal or organometallic does not negate the phosphorescence provided by the DHAE design.

One aspect of the directed heavy atom effect design principle is the use of aromatic ketones. While triplet-emitting organics are quite rare, aromatic ketones are known to provide weak phosphorescence, usually observable only at low temperatures and in very strict conditions (Kearns, D. R. & Case, W. A. Investigation of Singlet—Triplet Transitions by the Phosphorescence Excitation Method. III. Aromatic Ketones and Aldehydes. *J. Am. Chem. Soc.* 88, 5087-5097 (1966)). Spin-orbit coupling acting on the non-bound electrons of the carbonyl oxygen facilitates otherwise forbidden excited state intersystem crossing (Turro, N.J. *Modern Molecular Photochemistry* (University Science Books, Sausalito Calif., 1991) p. 98.). However, their phosphorescence is far too inefficient for practical applications at room temperature (Clark, W. D. K., Litt, A. D. & Steel, C. Triplet Lifetimes of Benzophenone, Acetophenone, and Triphenylene in Hydrocarbons. *J. Am. Chem. Soc.* 91, 5413-5415 (1969); Hoshino, S. & Suzuki, H. Electroluminescence from triplet excited states of benzophenone. *Appl. Phys. Lett.* 69, 224-226 (1996)). With one outlying exception, photoluminescent quantum yields (QYs) are reported to be well below one percent even in the best conditions, impractical though they are (Parker, C. A. & Joyce, T. A. Phosphorescence of Benzophenone in Fluid Solution *Chem. Comm.,* 749-750 (1968)).

The present technology synergistically utilizes the heavy atom effect and halogen bonding. The heavy atom effect is a means of promoting triplet generation by placing heavy atoms, usually halogens, in systems with triplet-allowing chromophores (Giachino, G. G & Kearns, D. R. Nature of the External Heavy-Atom Effect on Radiative and Nonradiative Singlet-Triplet Transitions. *J. Chem Phys.* 52, 2964-2974 (1970)). This is usually achieved by adding halogenated solvents or elemental halogens to chromophores as random mixtures. The present disclosure demonstrates that directing the halogen-chromophore contact greatly enhances the heavy atom effect. This is achieved via halogen bonding, a non-covalent interaction between the relatively electron poor end of a bound halogen and an electron rich nucleophile. In the present system, the nucleophile is the oxygen atom of an aromatic ketone; e.g., benzaldehyde. With the unbound electrons of the triplet-allowing carbonyl oxygen partially donated to a neighboring halogen (e.g., bromine), intersystem crossing becomes very dominant over singlet emission and internal conversion. In these examples, this directed heavy atom effect is achieved in a crystalline state so vibrational dissipation of the triplet is also suppressed resulting in long-lived and strong phosphorescent emission. That is, $S_1 \rightarrow T_n$ and $T_1 \rightarrow S_0 + h\nu$ is promoted and vibrational dissipation, $T_1 \rightarrow S_0 + heat$, is limited.

2,5-dihexyloxy-4-bromobenzaldehyde (Br6A), a relatively simple small molecule, exhibits the phenomena described above and emits phosphorescence only when in its solid state. FIG. 1a shows the structure of this compound. Br6A emits blue fluorescence in solution with a $\lambda_{max}$ at 420 nm, as shown in FIG. 1b. In its crystalline solid, Br6A emits distinctly green emission with a broad $\lambda_{max}$ ranging from 500-520 nm. Both emissions arise from excitation at 360 nm. This is depicted in FIGS. 1b and 1c. High quality crystals of pure Br6A exhibit QYs as high as 2.9% and quantum lifetimes of $\tau_{Ph}$=5.4 ms at room temperature and in ambient atmosphere. The 5.4 ms lifetime was measured from a drop-cast film of Br6A; longer lifetimes are possible for higher quality crystals. Such high QY from crystals, the highest possible concentration of the chromophore, is significant as organic triplet-emitters reported to date require strictly dilute conditions to produce any detectable emission. The directed heavy atom effect produces phosphorescence even in extremely condensed states.

Dilution of Br6A into a similar crystal matrix with similar bromine contact dramatically enhances QY as high as 68%. A "host" material should exhibit this crystal characteristic but not interfere optically with Br6A. 2,5-dihexyloxy-1,4-dibromobenzene (Br6) is structurally nearly identical to Br6A with a bromine atom replacing the aldehyde as shown in FIG. 2a. Its size, shape, and volumetric similarity makes Br6 an accommodating host to Br6A in cocrystals. Br6 is also highly crystalline and exhibits no emission at room temperature from solutions or solid states. Crystals grown from mixed solutions of Br6 and Br6A exhibit intense green phosphorescence, as seen in FIG. 2b. This emission is spectrally identical to phosphorescent emission from pure Br6A crystals. Both pure and mixed crystals are excited at 360 nm and, as FIG. 2c shows, Br6 absorbs narrowly at 300 nm indicating that the excitation/absorption and emission involves only the Br6A chromophore. Phosphorescent emission from cocrystals is polarized, demonstrating that the Br6A chromophore is ordered and suggesting substitutional inclusion or true cocrystallization.

Analysis of these two compounds by single crystal x-ray diffraction (XRD) reveals the directed heavy atom effect described above. FIG. 3a shows the bromine oxygen contact in Br6A crystals. The interatomic distance of 2.8 Å is well below the bromine-oxygen van der Waals distance of 3.37 Å indicating not only a halogen bond but one that ranks among the shortest reported (Metrangolo, P. & Resnati, G. Halogen Bonding: A Paradigm in Supramolecular Chemistry *Chem. Eur. J.* 7, 2511-2519 (2001)). The angle of 126° between the carbonyl π-bond and the halogen bond are also consistent with the literature (Auffinger, P., Hays, F. A., Westhof, E., Ho, P. S. Halogen bonds in biological molecules. *PNAS* 101, 16789-16794 (2004)). FIG. 3b shows the similarity of Br6 crystals to those of Br6A. A bromine-bromine distance of 3.3 Å (van der Waals distance is 3.7 Å) indicates a halogen-halogen interaction very similar to the halogen bond in Br6A. Using nearest aromatic carbons as a comparable distance, both Br6 and Br6A exhibit an aromatic spacing of 6.9 Å. The similarity between these crystals makes it a reasonable assumption that inclusion of Br6A into Br6 crystals is by substitution or that the two cocrystalize in a motif similar to their individual matrices.

A graphical depiction of this directed heavy atom effect demonstrated via simplified energy diagrams is shown in FIGS. 3c-e. In solution (or any non-crystalline state in ambient temperature) Br6A emits only weak blue fluorescence with QY $\Phi_{Fl}$=0.5-12% (varying by solvent), meaning no triplet emission and dominant non-radiative decay of the excited state. Well-ordered crystals of Br6A emit negligible fluorescence and dominant phosphorescence. The halogen bond seen in XRD directs the heavy atom effect enhancing inter-system crossing beyond intrinsic levels to make singlet emission nearly zero. The rigidity of the crystal and tight packing brought on by the halogen bond prevent vibrational decay of the triplets making internal conversion less competitive with phosphorescent emission. The local heavy atom also enhances spin-orbit coupling promoting $T_1 \rightarrow S_0 + h\nu$. When Br6A is diluted into Br6 as cocrystals, triplet-triplet annihilation and excimer formation are also greatly reduced enhancing triplet emission even further.

As high crystalline order is required to observe strong phosphorescence, cocrystal QYs are subject to a number of thermodynamic variables regarding the formation of the crystals. Achieving high QY is directly dependent on efficient inclusion of Br6A into Br6 crystals. QYs measured for cocrystals grown from dropcasts onto glass from 1 wt % Br6A/Br6 solutions of chloroform have been measured as high as $\Phi_{Ph}$=68% and as low as $\Phi_{Ph}$=54%. These examples exhibit the highest QYs measured for any Br6A/Br6 cocrystals grown thus far.

To probe the efficacy of this design principle on other crystals and to also attempt to color-tune these chromophores, a series of similar compounds were designed and synthesized. FIG. 4a shows the molecular structures of three other systems, BrC6/BrC6A, BrS6/BrS6A, and Np6/Np6A. Each compound has variations to its central chromophore that either reduce (BrC6A) or increase (BrS6A and Np6A) the electron density. BrC6A replaces alkoxy substituents with alkyl to reduce electron donation to the ring while BrS6A uses thiol ethers to increase electron donation relative to alkoxy. Np6A uses a naphthalene core to increase electron density even further.

As FIGS. 4b and 4c show, the effect is broad color tuning from blue to orange. Each chromophore is cocrystallized with its dibromo analog. Crystals shown are grown slowly from chloroform solution to achieve high order as large crystals. By increasing the electron density, it is possible to effectively raise or lower the highest occupied molecular orbital to either raise or lower the bandgap and associated triplet state. As in the Br6A/Br6 system, shorter wavelength fluorescence is seen from the aldehydes in solution with higher wavelength phosphorescent emission (that shown in FIG. 4b and c) only visible once crystallized.

Effects of changing the halogen on the Br6A molecule by replacing bromine with chlorine and iodine are also demonstrated. Chlorinated aldehyde (i.e. C16A) exhibited a 5 nm blue-shift and iodinated aldehyde (I6A) induced a 5 nm red-shift of the phosphorescent emission $\lambda_{max}$ relative to Br6A. As provided by these examples, the novel design principle of the directed heavy atom effect is shown to be readily applicable to other systems and substituting the aldehyde moiety into a di-bromo aromatic compound can make a similarly sized compound fit for cocrystallization.

All reagents were purchased from Sigma-Aldrich with the exceptions of di-n-hexyldisulfide and 1,4-dibromobenzene, which were purchased from Alfa Aesar. All reagents were used as purchased without additional purification. NMR spectra were collected on a Varian Inova (500) with deuterated solvents purchased from Cambridge Isotope Labs, Inc.

UV absorption data was collected on a Varian Cary 50 Bio spectrometer. Photoluminescent excitation and emission spectra as well as quantum yields and phosphorescent lifetime data were collected on a Photon Technologies International, Inc. (PTI) QuantaMaster equipped with an integrating sphere. Phosphorescent lifetime data was collected using a PTI LaserStrobe. Quantum lifetime calculations were carried out on the FeliX32 software partnered with the PTI equipment.

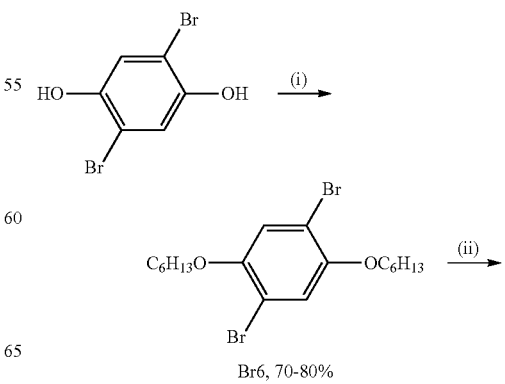

Scheme 1.

Br6, 70-80%

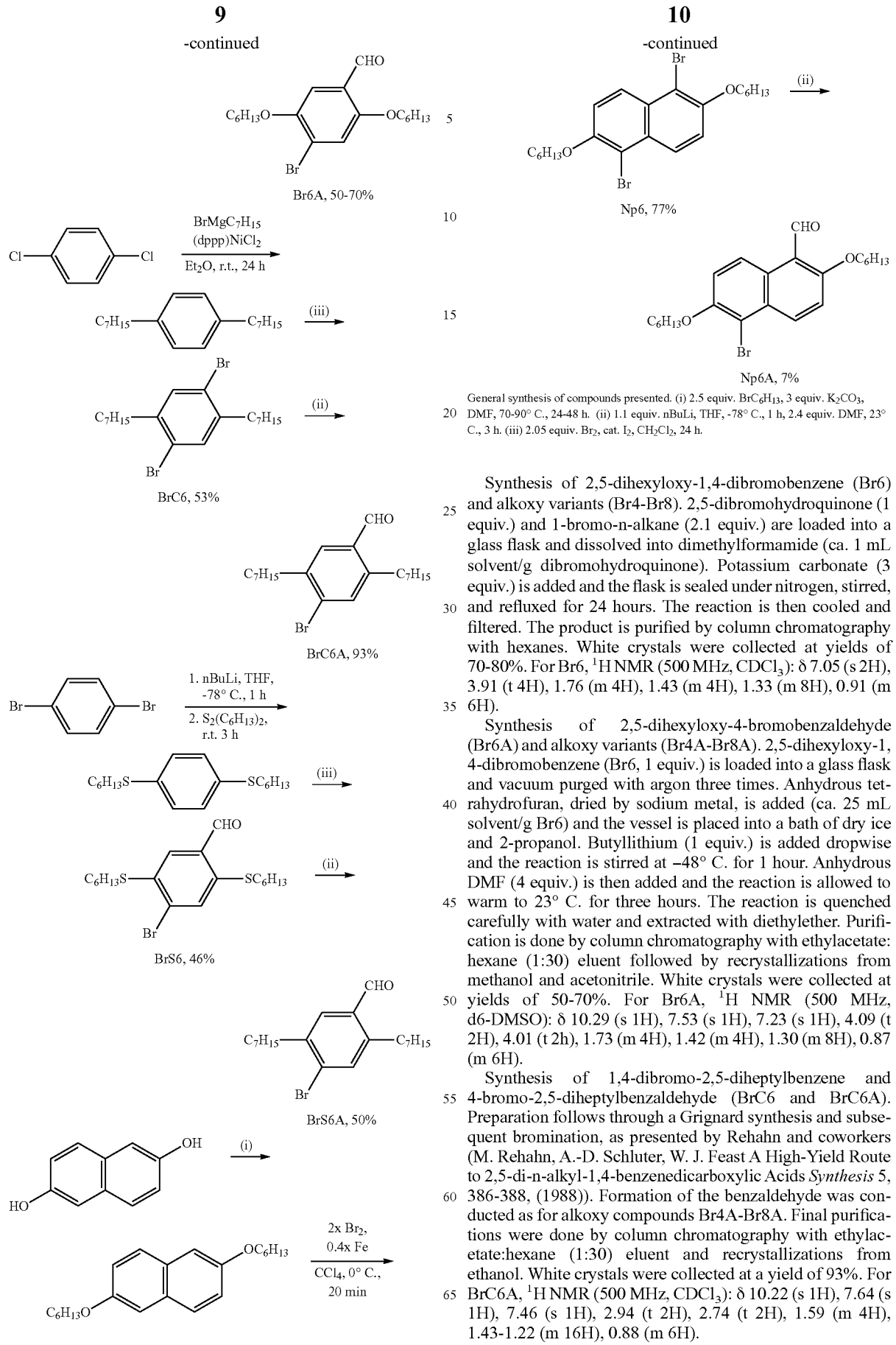

General synthesis of compounds presented. (i) 2.5 equiv. BrC$_6$H$_{13}$, 3 equiv. K$_2$CO$_3$, DMF, 70-90° C., 24-48 h. (ii) 1.1 equiv. nBuLi, THF, -78° C., 1 h, 2.4 equiv. DMF, 23° C., 3 h. (iii) 2.05 equiv. Br$_2$, cat. I$_2$, CH$_2$Cl$_2$, 24 h.

Synthesis of 2,5-dihexyloxy-1,4-dibromobenzene (Br6) and alkoxy variants (Br4-Br8). 2,5-dibromohydroquinone (1 equiv.) and 1-bromo-n-alkane (2.1 equiv.) are loaded into a glass flask and dissolved into dimethylformamide (ca. 1 mL solvent/g dibromohydroquinone). Potassium carbonate (3 equiv.) is added and the flask is sealed under nitrogen, stirred, and refluxed for 24 hours. The reaction is then cooled and filtered. The product is purified by column chromatography with hexanes. White crystals were collected at yields of 70-80%. For Br6, $^1$H NMR (500 MHz, CDCl$_3$): δ 7.05 (s 2H), 3.91 (t 4H), 1.76 (m 4H), 1.43 (m 4H), 1.33 (m 8H), 0.91 (m 6H).

Synthesis of 2,5-dihexyloxy-4-bromobenzaldehyde (Br6A) and alkoxy variants (Br4A-Br8A). 2,5-dihexyloxy-1,4-dibromobenzene (Br6, 1 equiv.) is loaded into a glass flask and vacuum purged with argon three times. Anhydrous tetrahydrofuran, dried by sodium metal, is added (ca. 25 mL solvent/g Br6) and the vessel is placed into a bath of dry ice and 2-propanol. Butyllithium (1 equiv.) is added dropwise and the reaction is stirred at −48° C. for 1 hour. Anhydrous DMF (4 equiv.) is then added and the reaction is allowed to warm to 23° C. for three hours. The reaction is quenched carefully with water and extracted with diethylether. Purification is done by column chromatography with ethylacetate: hexane (1:30) eluent followed by recrystallizations from methanol and acetonitrile. White crystals were collected at yields of 50-70%. For Br6A, $^1$H NMR (500 MHz, d6-DMSO): δ 10.29 (s 1H), 7.53 (s 1H), 7.23 (s 1H), 4.09 (t 2H), 4.01 (t 2h), 1.73 (m 4H), 1.42 (m 4H), 1.30 (m 8H), 0.87 (m 6H).

Synthesis of 1,4-dibromo-2,5-diheptylbenzene and 4-bromo-2,5-diheptylbenzaldehyde (BrC6 and BrC6A). Preparation follows through a Grignard synthesis and subsequent bromination, as presented by Rehahn and coworkers (M. Rehahn, A.-D. Schluter, W. J. Feast A High-Yield Route to 2,5-di-n-alkyl-1,4-benzenedicarboxylic Acids *Synthesis* 5, 386-388, (1988)). Formation of the benzaldehyde was conducted as for alkoxy compounds Br4A-Br8A. Final purifications were done by column chromatography with ethylacetate:hexane (1:30) eluent and recrystallizations from ethanol. White crystals were collected at a yield of 93%. For BrC6A, $^1$H NMR (500 MHz, CDCl$_3$): δ 10.22 (s 1H), 7.64 (s 1H), 7.46 (s 1H), 2.94 (t 2H), 2.74 (t 2H), 1.59 (m 4H), 1.43-1.22 (m 16H), 0.88 (m 6H).

Synthesis of (2,5-dibromo-1,4-phenylene)bis(hexylsulfane) (BrS6). 1,4-Dibromobenzene is loaded into a glass flask and vacuum purged with argon three times. Anhydrous tetrahydrofuran, dried by sodium metal, is added (ca. 10 mL solvent/g) and the vessel is placed into a bath of dry ice and 2-propanol. Butyllithium (2.1 equiv.) is added dropwise and the reaction is stirred at −48° C. for 1 hour. Di-n-hexyldisulfide (2 equiv.) is then added and the reaction is allowed to warm to 23° C. for three hours. The reaction is quenched carefully with water and extracted with diethylether. Purification is done by column chromatography with hexanes followed by recrystallization from methanol. The product is brominated via the same reaction conditions of Rehahn and coworkers and purified by column chromatography with hexanes followed by recrystallization from methanol. Fine white crystals are collected at an overall yield of 46%. For BrS6, $^1$H NMR (500 MHz, CDCl$_3$): δ 7.37 (s 2H), 2.91 (t 4H), 1.70 (m 4H), 1.49 (m 4H), 1.33 (m 8H), 0.90 (m 6H).

Synthesis of 4-bromo-2,5-bis(hexylthio)benzaldehyde (BrS6A). BrS6 was converted to BrS6A by the same methods as Br6A and BrC6A, using butyllithium and dimethylformamide. Products were purified by column chromatography with ethylacetate:hexane (1:30) eluent followed by recrystallization from methanol. Yellow powder is collected at a yield of 50%. For BrS6A, $^1$H NMR (500 MHz, CDCl$_3$): δ 10.39 (s 1H), 7.64 (s 1H), 7.61 (s 1H), 3.00 (t 2H), 2.91 (t 2H), 1.73-1.65 (m 4H), 1.46 (m, 4H), 1.34-1.28 (m 8H), 0.89 (m 6H).

Synthesis of 1,5-dibromo-2,6-bis(hexyloxy)naphthalene (Np6). 2,6-bis(hexyloxy)naphthanele was converted from naphthalene-2,6-diol by Williamson ether synthesis as described for Br4-Br8. White flakes are collected at a 24% yield. 2,6-bis(hexyloxy)naphthanele is then brominated in carbontetrachloride with two equivalents of bromine in the presence of 0.4 equiv. of iron catalyst. After 30 minutes, the reaction is quenched with sodium sulfite. Recrystallization from ethanol yields white needle crystals of Np6 at 77% yield. For Np6, $^1$H NMR (500 MHz, CDCl$_3$): δ 8.21 (d 2H), 7.32 (d 2H), 4.18 (t 4H), 1.88 (m 4H), 1.57 (m 4H), 1.39 (m 8H), 0.94 (m 6H).

Synthesis of 5-bromo-2,6-bis(hexyloxy)-1-naphthaldehyde (Np6A). Np6 was converted to Np6A using the same methods as Br6A, BrC6A, and BrS6A. Products were purified by column chromatography with ethylacetate:hexane (1:30) eluent followed by recrystallization from methanol. Yellow powder is collected at a yield of 7%. For Np6A, $^1$H NMR (500 MHz, CDCl$_3$): 10.89 (s 1H), 9.3 (d 1H), 8.53 (d, 1H), 7.36 (m 2H), 4.22 (t 2H), 4.18 (t 2H), 1.88 (m 4H), 1.54 (m 4H), 1.37 (m 8H), 0.92 (m 6H).

Structure determination of synthesized compounds included the following aspects. Colorless plates of Br6 were grown from a methanol solution at 25° C. A crystal of dimensions 0.40×0.36×0.06 mm was mounted on a standard Bruker SMART 1K CCD-based X-ray diffractometer equipped with a LT-2 low temperature device and normal focus Mo-target X-ray tube (λ=0.71073 A) operated at 2000 W power (50 kV, 40 mA). The X-ray intensities were measured at 108(2) K; the detector was placed at a distance 4.912 cm from the crystal. A total of 4095 frames were collected with a scan width of 0.5° in ω and phi with an exposure time of 20 s/frame. The integration of the data yielded a total of 15030 reflections to a maximum 2θ value of 56.64° of which 2332 were independent and 2189 were greater than 2σ(I). The final cell constants (see Table 1 below) were based on the xyz centroids of 5428 reflections above 10σ(I). Analysis of the data showed negligible decay during data collection; the data were processed with SADABS and corrected for absorption. The structure (FIG. 5) was solved and refined with the Bruker SHELXTL (version 6.12) software package, using the space group P1bar with Z=1 for the formula C$_{18}$H$_{28}$O$_2$Br$_2$. All non-hydrogen atoms were refined anisotropically with the hydrogen atoms placed in idealized positions. The molecule lies on an inversion center in the crystal lattice. Full matrix least-squares refinement based on F2 converged at R1=0.0190 and wR2=0.0497 [based on I>2sigma(I)], R1=0.0213 and wR2=0.0506 for all data.

TABLE 1

| Structure data of Br6. | |
|---|---|
| Name | Br6 |
| Formula | C$_{18}$H$_{28}$Br$_2$O$_2$ |
| Space Group | P-1 |
| Cell Lengths | a 6.8032(10) b 8.117(3) c 9.659(3) |
| Cell Angles | α 108.27(3) β 106.91(3) γ 96.94(2) |
| Cell Volume | 471.218 |
| Z, Z' | Z: 1 Z': 0 |
| R-Factor (%) | 1.9 |

Colorless blocks of Br6A were grown by slow evaporation of a methanol solution at 25° C. A wedge-shaped crystal of dimensions 0.27×0.22×0.15 mm was cut from a larger mass and mounted on a Bruker SMART APEX CCD-based X-ray diffractometer equipped with a low temperature device and fine focus Mo-target X-ray tube (λ=0.71073 A) operated at 1500 W power (50 kV, 30 mA). The X-ray intensities were measured at 85(1) K; the detector was placed at a distance 5.055 cm from the crystal. A total of 4095 frames were collected with a scan width of 0.5° in ω and 0.45° in phi with an exposure time of 15 s/frame. The integration of the data yielded a total of 33365 reflections to a maximum 2θ value of 56.72° of which 4669 were independent and 4444 were greater than 2σ(I). The final cell constants (see Table 2 below) were based on the xyz centroids of 9960 reflections above 10σ(I). Analysis of the data showed negligible decay during data collection; the data were processed with SADABS and corrected for absorption. The structure (FIG. 6) was solved and refined with the Bruker SHELXTL (version 6.12) software package, using the space group P1bar with Z=2 for the formula C$_{19}$H$_{29}$O$_3$Br. All non-hydrogen atoms were refined anisotropically with the hydrogen atoms placed in idealized positions. Full matrix least-squares refinement based on F2 converged at R1=0.0225 and wR2=0.0606 [based on I>2sigma(I)], R1=0.0241 and wR2=0.0615 for all data.

TABLE 2

| Structure data for Br6A. | |
|---|---|
| Name | Br6A |
| Formula | C$_{19}$H$_{29}$BrO$_3$ |
| Space Group | P-1 |
| Cell Lengths | a 9.5083(8) b 9.6863(8) c 10.9481(9) |
| Cell Angles | α 68.5630(10) β 85.8470(10) γ 84.9170(10) |
| Cell Volume | 934.004 |
| Z, Z' | Z: 2 Z': 0 |
| R-Factor (%) | 2.25 |

The structure determination methods employed aspects described by: Sheldrick, G. M. SADABS, v. 2007/4. Program for Empirical Absorption Correction of Area Detector Data, University of Gottingen: Gottingen, Germany, 2007; Sheldrick, G. M. SHELXTL, v. 6.12; Bruker Analytical X-ray, Madison, Wis., 2001; Sheldrick, G. M. CELL_NOW, Program for Indexing Twins and Other Problem Crystals, University of Gottingen: Gottingen, Germany, 2003; Sheldrick, G. M. TWINABS, v. 1.05. Program for Empirical Absorption Correction of Area Detector Data, University of Gottingen: Gottingen, Germany, 2005; and Saint Plus, v. 7.34, Bruker Analytical X-ray, Madison, Wis., 2006.

As a result, the present disclosure provides a novel molecular design strategy to impart high efficiency phosphorescence in metal-free organic compounds using the directed heavy atom effect. By cocrystallizing aromatic aldehydes with analogous aromatic halogens (e.g., bromides), halogen bonding enhances the heavy atom effect and inter-system crossing becomes very dominant over singlet decay and internal conversion. In crystal states, vibrational suppression contributes to allow triplet emission to be as efficient as 68% at room temperature. With this design principle, there exists a means for the broad class of metal-free organic compounds to emit efficient phosphorescence in ambient conditions, removing the strict limitations on current organic phosphor design. The directed heavy atom effect also represents a unique use for halogen bonding.

The present technology further includes highly emissive and stable room-temperature organic phosphorescent molecules within an analogous organic matrix. As disclosed above, a series of metal-free organic phosphorescent compounds are provided that are not emissive in solution but are emissive in liquid nitrogen. Without being limited by theory, it is believed that the energy that is dissipated by vibration at room temperature is suppressed in liquid nitrogen. However, when an organic phosphorescent compound is mixed with a similarly structured analogous organic crystal, the combination can produce about a 68% quantum yield in the solid-state at room temperature. Again, without being limited by theory, it appears that the vibrational decay pathway is suppressed by the crystalline "cage." When the crystal melts, the emission disappears as well. Recrystallization of the melt brings the emission back. The pure analogous crystal matrix itself also has phosphorescence emission in liquid nitrogen but not at room temperature in solution.

Accordingly, several similar molecules and analogous organic matrices can be prepared and provide identical phenomena. Different colors can also be made by altering the chemical structure of these compounds. This allows the molecular design of highly emissive pure organic phosphorescence materials for use at room temperature.

These materials can be used in several applications. Because the molecule itself does not have any real π-conjugation, the molecule is not affected by photo-bleaching and consequently overcomes one of the most challenging problems organic electronic materials can face. In particular, the present molecules have been exposed to a strong UV light and high temperature for an extended time and no deterioration of the emission property was observed. Quantum yield is about 68%, which is quite high. Any flexible substrates can be used, allowing flexible display fabrication and solid-state lighting devices. The crystals are needle-like and appear to provide a polarized emission. Through molecular epitaxy, large scale polarized emission devices can be easily fabricated. Highly sensitive fluorescent sensors can therefore be designed due to the extended conjugation through the crystal. Highly emissive and stable organic quantum dots are another important application for bioimaging and other applications. High efficiency organic TFT is another directional application. And an organic laser is another approach that can use this new chemical.

An example of these materials includes mixing an aromatic halogen aldehyde into a crystal of an aromatic halogen to provide a highly emissive and stable room-temperature organic phosphorescent material. Such a material can be formed by mixing molecules represented by the following structures:

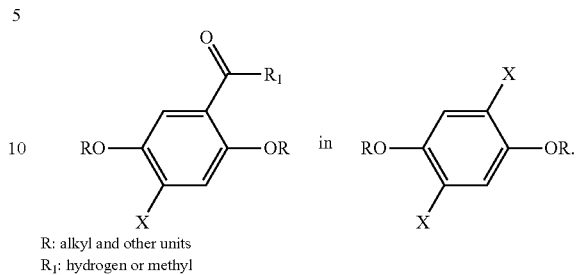

R: alkyl and other units
R₁: hydrogen or methyl

As described, a series of pure organic compounds, free of metal atoms, that exhibit bright phosphorescence at room temperature when crystallized is provided by the present technology. In solution, these compounds emit no phosphorescence (unless at cryogenic temperatures). However, when these compounds are crystallized, they exhibit a novel directed heavy atom effect that produces a combination of benefits culminating in bright phosphorescence, far brighter than any reported solid state, non-metallic organic. By crystallizing these compounds into analogous compounds that do not have the same aldehyde functional group, an inert host matrix is made. This allows the emissive compound to be diluted into a crystal that exhibits the same directed heavy atom effect but is optically non-interfering, allowing materials to achieve ambient solid-state quantum efficiencies measured as high as 68%, for example. This design has allowed synthesis of several variations on this theme in order to tune the emission color, melting temperature, density, and other physical properties of the material, creating an entire variable class of metal-free, non-conjugated organic phosphorescent materials.

These materials can be used in many applications. Because these molecules can be very bright (quantum yields of 68% are relatively very high) without any π-conjugation, these molecules can be photo-bleach free, which is one of the most challenging problems organic electronic materials face (after extended exposure to intense UV light the material retained its emission). Flexible displays and solid-state lighting are examples of electronic applications for these materials. In addition, such materials can be used in photovoltaics as well as thin-film transistors, where the unique charge-handling properties of these materials can be useful. Such crystals also emit polarized light, which can allow for the fabrication of large scale polarized emission devices. Sensing motifs, such as phosphorescent bio- and chemo-sensors, are also possible, for example, in the form of beacons such as highly emissive and stable organic quantum dots.

The metal-free organic phosphorescent materials can also be used in the following ways. In one way, phosphorescence can be enhanced by polymer entanglement or secondary bonding. As described, directed and amplified heavy atom effects through halogen bonding in a crystalline form renders strong phosphorescence emission from organic materials. The requirement of not only well-ordered crystal states, but states that exhibit strong halogen bonding may be restrictive in some applications. However, a viable alternative to crystals exists in the form of polymer embedding.

To this end, 4-bromo-2,5-di((2-ethylhexyl)oxy)benzaldehyde (BrEHA) whose chemical structure is shown in FIG. 1, was designed. It is akin to Br6A but has 2-ethylhexyl substitutents in place of Br6A's hexyloxy. The additional branch in BrEHA prevents packing so well that. BrEHA is an oily liquid at room temperature and remains liquid even at −12° C. The oily BrEHA is mainly fluorescent, as can be seen in FIG. 9. When BrEHA was embedded into polystyrene (PS), the phosphorescence peak appeared (FIG. 9A). The phosphorescence peak became stronger when the branched α-methyl PS was used (FIG. 9E). The same trend was observed in polymethacrylate (PMA) and polymethylmethacrylate (PMMA) (FIG. 9D).

Accordingly, a means is provided for determining polymers that can efficiently activate the phosphorescent emission from the chromophores by the concept of entanglement. Systematic evaluation of the correlation between the phosphorescence emission intensity and the physicochemical properties of the matrix polymer can be achieved. For example, glass transition temperature, melting temperature, free volume, entanglement possibility, and secondary bonding through side chains (see FIG. 10) can be adjusted and the resultant effects on the system determined.

Further examples of compounds are shown in FIG. 11. The compounds EH-Amide BRA6 and/or EG-Amide BrA6 can provide a phosphorescent composition where the amorphorous part of the compound provides for a uniform film and the crystalline part provides for packing and maintaining the distance between the oxygen of the carbonyl group at less than the van der Waals radii of the oxygen of the carbonyl group and the halogen atom. In this way, the compound can be mixed with a polymer, providing polymer entanglement or secondary bonding (e.g., hydrogen bonding), or the Br and CHO forms of the compounds can be mixed together to provide phosphorescence. The compounds having amide linkage(s) can further provide a higher melting temperature. At the same time, hydrogen bonding with nylon-like polymers can provide secondary bonding capability and can make such compounds highly emissive, as illustrated in FIG. 10. Phosphorescence of the Br and CHO forms of these compounds and their combinations are shown in FIG. 12.

Polymer entanglement further includes the following aspects with respect to emissive, non-crystalline directed heavy atom effect (DHAE) phosphors. Demonstrated here, aldehydes like those presented earlier can become brightly phosphorescent when embedded into certain polymers, entirely removing the requirement of crystallinity. The versatility of this approach is quite wide. Even completely amorphous, liquid benzaldehydes can become brightly phosphorescent at room temperatures if embedded into a proper polymer matrix. One aspect is to use a glassy polymer that will achieve excellent entanglement with the chromophore. As defined here, entanglement is the efficiency at which a polymer backbone mixes with the alkyl substitutents of the benzaldehyde phosphors. By choice of polymer and subsequent optical analysis, it is demonstrated that polymers whose backbones more closely mimic the chains of the aldehyde can produce a brighter phosphorescent emission, presumably due to reduced vibrational freedom of the chromophore. This not only validates a versatile, completely non-crystalline metal-free organic phosphor design principle, it also offers a new means to probe polymer solid-state properties and provides another paradigm for polymer characterization.

The DHAE design principle provides an effective tool for designing metal-free organic phosphors, though its requirements may restrict its use in some situations. The need of not only well-ordered crystal states, but states that exhibit strong halogen bonding, can be too demanding to designers in some applications. Here, though, a viable alternative to crystals is presented in the form of polymer blends.

DHAE phosphors (e.g., substituted benzaldehydes) can be embedded into rigid polymers to achieve a tight packing similar to that in crystals. By restraining the chromophore, polymers can remove vibrational pathways to non-emissive relaxation from $T_1$, which brings about phosphorescent emission from the chromophore without the need of crystal order. This type of situation can exist for organometallic phosphors, where phosphorescent quantum yields are seen to improve in polymer hosts in some instances. The difference here is that, rather than simply increasing already high QYs, certain polymers can raise room temperature phosphorescent QYs of substituted benzaldehydes up from essentially zero to visible levels of about 1%, for example. Thus, polymer hosts can activate phosphorescent emission in otherwise non-emissive metal-free chromophores.

As evidenced, however, not all polymer-phosphor combinations lead to strong phosphorescence. In fact, some combinations can fail to produce any detectable phosphorescent emission. The present disclosure identifies the concept of entanglement, which provides a means to determine which polymers can efficiently activate phosphorescent emission. If the polymer backbone has structural similarity to the alkyl substitutions of the chromophore, and if the polymer has small, non-hindering pendants/sidechains, entanglement with the chromophore is good and emission is strong. If the polymer does not share any structural similarity with the chromophore or if it has a rigid backbone and/or large bulky pendants/sidechains, the polymer and chromophore segregate, resulting in poor entanglement and little or no phosphorescence.

As an example, a DHAE style chromophore having the systematic name 4-bromo-2,5-di((2-ethylhexyl)oxy)benzaldehyde (BrEHA) is used. The structure of BrEHA can be depicted as:

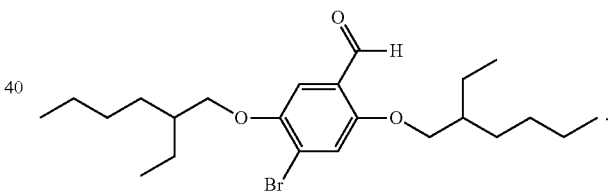

It is akin to Br6A, but has 2-ethylhexyl substitutents in place of Br6A's hexyloxy groups. The additional branch in BrEHA makes the compound considerably less ordered/crystalline. The bulkiness of the ethylhexyl chains prevents packing so well that BrEHA is an oily liquid at room temperature and remains liquid even at −12° C. At extremely low temperatures (77 K was tested) it does crystallize in thin needles that strongly resemble to spherulite-like structures of BrE6 crystals.

In some aspects, BrEHA was originally designed to be a suitable negative control for DHAE phosphors, specifically Br6A. Like Br6A, BrEHA is an alkoxy-substituted bromobenzaldehyde. Unlike Br6A, it does not crystallize spontaneously, which is desirable here. For, if one were to mix a crystalline DHAE phosphor, such as Br6A, into a polymer there would be a possibility that the small molecule chromophore would simply isolate and crystallize within the polymer. Phosphorescent emission would then be detected even though there is no chromophore/phosphor interaction of interest. BrEHA is a liquid and thus works perfectly to explore chromophore/polymer interactions because it produces none of this potential 'background' phosphorescence.

BrEHA alone emits no detectable phosphorescence at room temperature. FIG. 13 shows the PL emission and excitation of BrEHA. The fluorescent peak at $\lambda_{max}$=410 nm is especially dominant in the emission spectrum and the excitation spectrum shows a shouldered peak with $\lambda_{max}$=385 nm that is very similar to the fluorescent emission of other BrnA compounds, such as Br6A (especially when they are observed in chloroform solution).

Mixed with certain polymers, BrEHA can begin to emit visibly bright phosphorescence. If the polymer is chosen correctly, this phosphorescence can become very dominant over BrEHA's intrinsic fluorescence. A series of widely varying polymer structures were explored as potential host materials for BrEHA in this capacity. Conjugated and conducting polymers were examined along with a sizeable portion of the poly(methacylic acid) family. Several polymer characteristics might be used as potential variables for attenuating the strength of the phosphorescent emission. Investigation of density, crystallinity, glass transition temperature, free volume, and molecular weight of various polymers were investigated, however, with no observable correlations. As such, it appears that structural similarity generally explains the trends in emission. From this, the notion of entanglement was born.

To best illustrate entanglement, four example polymers, being some of the brightest phosphorescent-producing polymers tested, were utilized. These include poly(methylacrylate) (PMA), poly(methylmethacrylate) (PMMA), poly(styrene) (PS), and poly($\alpha$-methyl styrene) (PaMS), where their chemical structures can generally be represented as follows:

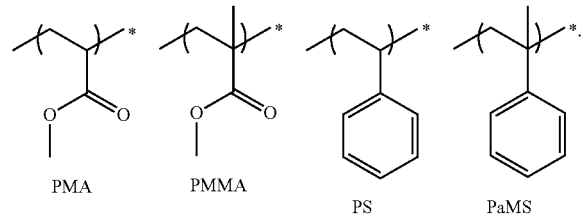

Each is a common polymer with vinyl backbones and small pendants. Additional methyl substitution on the polymer backbone differentiates PMMA from PMA and PaMS from PS. For blends with BrEHA, these subtle additions prove to make an enormous difference. Other glassy polymers similar to the above can provide various degrees of entanglement and can provide similar emission enhancements.

BrEHA is co-dissolved into chloroform with each of the polymers at a ratio of ten weight percent BrEHA (relative to polymer content). Polymer films were dropcast from this solution onto a clean glass substrate and dried in-vacuo for several hours to ensure complete removal of the solvent. The resulting films appeared clear and homogenous (as bulk) though their surfaces were noticeably rough and very clearly terraced. Each sample was excited at 365 nm and their PL emissions measured. The results from these tests are shown in FIG. 14. The emission of pure, liquid BrEHA is shown also as reference.

Fluorescence is detected from each polymer blend sample. This is in accord with other aspects of DHAE presented herein because the polymers are acting to prevent vibrational freedom of the chromophore. They are not promoting intersystem crossing like cocrystal hosts, for example. Thus they are not affecting singlets in any notable way. The only notable effect these polymers have on the excited state activity of the chromophore is that they act to restrict vibrational loss of the triplet. Because the fluorescent emission is thus expected to be unaffected by the polymer, the peak seen usually at $\lambda_{max}$=410 nm is used as a common feature in each sample and is normalized in FIG. 14. Data here is given as spectral comparison only because QYs were below the ca. 1% detection limit of the equipment employed. It is suspected that the QYs measured are lower than actual and that the low numbers may be an artifact of the test method.

PMA films produced very little phosphorescence. The PL emission spectrum is predominantly fluorescent with only a small phosphorescent shoulder. The intensity ratio of the phosphorescence ($\lambda_{max}$=500 nm) to fluorescence ($\lambda_{max}$=410 nm) is 0.40. On the other hand, PMMA, different from PMA only in the additional methyl backbone substitution, is very phosphorescent. The intensity ratio of the phosphorescence ($\lambda_{max}$=520 nm) to fluorescence ($\lambda_{max}$=411 nm) is 1.87. As a host for BrEHA, PMMA is 4.67 times brighter in phosphorescence than is PMA.

Brighter than PMA, PS (which is also free of methyl backbone substitution) is moderately phosphorescent. The intensity ratio of the phosphorescence ($\lambda_{max}$=522 nm) to fluorescence ($\lambda_{max}$=410 nm) is 0.80, which is twice the brightness of PMA films. PaMS, though, makes a much brighter phosphor. Its intensity ratio of phosphorescence ($\lambda_{max}$=520 nm) to fluorescence ($\lambda_{max}$=410 nm) is 3.40. As a phosphor host (to BrEHA) PaMS is 4.25 times brighter than is PS. The trend follows both families; methyl substituted backbones are much brighter phosphor hosts than those without. Also, both poly(styrenes) outperform their poly(methacylate) counterparts: PS>PMA and PaMS>PMMA.

Optical micrographs of these polymer-embedded phosphor systems show select regions of emission. FIG. 15 shows an optical micrograph of a BrEHA/PMMA films under 365 nm UV light. The image shows what appear to be diffuse regions of green phosphorescent emission that do not correlate to any feature in the bulk polymer, which forms a homogenous film across the surface. On these view scales, it is not possible to tell whether this indicates that BrEHA is isolated into pockets separate from the polymer, but it can be certain that there is some form of phase segregation happening in these blends. The phosphorescent emission is non-homogenous.

From these observations the idea of entanglement is proposed. FIG. 16 shows schematically what is meant by polymer entanglement. In order for polymers to succeed as hosts to BrEHA, or any DHAE phosphor, it appears that they should share some structural similarity with the small molecule. This is not unlike determining an adequate crystalline host for DHAE phosphor design, as already described. The polymer must be able to mix well with the chromophore in order to constrain its flexible substitutents and prevent vibrational losses.

All of the four effective host polymers (those shown in FIG. 14) have some degree of similarity to BrEHA. They all have vinyl backbones, which are like the alkyl substitutents of BrEHA, and they all have relatively small pendants, methyl ester or benzene. The first aspect is important because it allows the ehtylhexyl portions of BrEHA to intertwine with the polymer backbones as they dry into their glassy state in order for the chromophore to be held in place. Rigid-rod polymers, such as poly(p-phenylene ethynylenes) (PPE) and poly(p-phenylenes) (PPP), were attempted as hosts and failed to produce any phosphorescent emission. Their backbones are too unlike any part of BrEHA and their rigid structures prevent entanglement in any capacity; for example, to analogize one cannot tie a knot with sticks. The second aspect, small pendants, is important because it allows the BrEHA molecule to get close enough to the polymer to achieve intertwining of the substitutent(s). Some larger-pendant polyvinyl polymers were used (e.g., poly(vinyl carbazole) (PVK), poly(isopropyl methacrylate), and poly(benzyl methacrylate)) and failed to produce phosphorescence. These polymers have a proper backbone, but their larger pendants are believed to essentially block it from interactions with BrEHA.

Another consideration regarding pendant choice is demonstrated by the differences between the poly(methacrylates) and poly(styrenes). Both poly(styrenes) perform better than their poly(methacrylate) counterparts. Without being bound by theory, this could be due to the structural similarity between their phenyl substitutions and the aromatic structure of BrEHA. Methacylate, on the other hand, shares no distinct similarity to BrEHA, which contains no methoxy or ester feature. This may be creating enhanced solid-state interaction between the styrenes, perhaps even some form of π-π interaction that is absent in blends with the methacrylates and is likely why those blends are brighter phosphors.

A surprising finding from these experiments is the profound effect that the methyl substitution makes. The two polymers presented without methyl substitutents on their backbones, PMA and PS, are markedly less phosphorescent as hosts than those that do have it, PMMA and PaMS. Though this structural difference is rather subtle it has a profound effect on the brightness of phosphorescent emission from BrEHA, which means that it likely has a profound effect on the efficiency of mixing between the polymer and small molecule, that it works better to suppress vibrational freedom of the system, or that both occur. BrEHA has a branched alkyl chain that may exhibit a favorable solid-state interaction with the additional branching of the methyl-substituted backbones. It is also possible that the additional methyl group helps to fill voids near the polymer backbone, restricting vibrational freedoms better than their methyl-free polymer brothers.

The following methods and details were employed in the polymer entanglement experiments. All chemicals used were purchased from Sigma Aldrich and used without further purification. Deuterated solvents for NMR were purchased from Cambridge Isotope Laboratories. Proton NMR was conducted on a Varian Mercury 300 using CDCl3 solvent with chemical shifts identified relative to 0.05 v/v % tetramethylsilane standard (0.00 ppm). Anhydrous tetrahydrofuran was generated by refluxing over sodium metal and benzophenone collected only from deep purple solution.

UV Absorption measurements were collected using a Varian Cary 50 Bio spectrometer with a solution samples held in a quartz cuvette. PL emission, excitation, and quantum yield data were collected using a Photon Technologies International (PTI) Quantamaster system equipped with an integrating sphere. Optical micrographs are collected using an Olympus BX51 optical microscope equipped with a Mercury lamp UV light source and Olympus DP71 color digital camera. Polymer film preparation is as described above.

The following synthesis and characterization aspects were used. The synthetic route to BrEH6A was as follows:

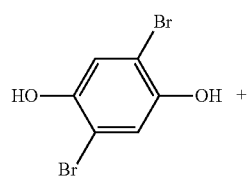

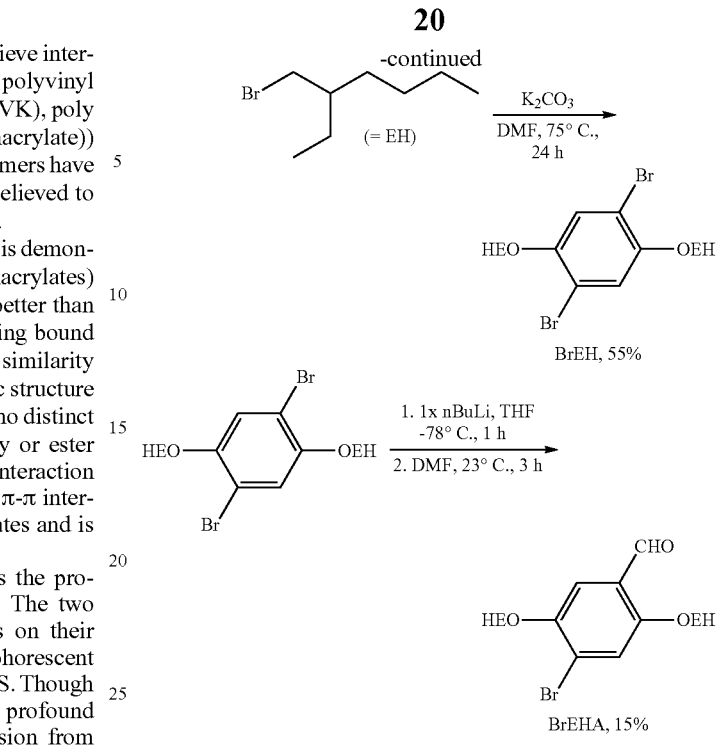

Synthesis of 1,4-dibromo-2,5-di((2-ethylhexyl)oxy)benzene (BrEH) 2,5-dibromohydroquinone (1 equiv.) is loaded into a 2-neck glass round bottomed flask along with 1-bromo-2-ethylhexane (2.5 equiv.) and dimethylformamide (ca. 1 mL/g reagent). Potassium carbonate (3 equiv.) is added and the reaction is stirred at 75° C. for 24 hours. The reaction is cooled, vacuum filtered, and rotavaped at 80° C. to remove solvents (DMF). The products are then purified through column chromatography using a hexanes eluent. A clear liquid is collected at a yield of 55%. For BrEH, $^1$H NMR (300 MHz, CDCl$_3$): 7.10 (s 2H), 3.85 (d 4H), 1.77 (m 2H), 1.51 (m 8H), 1.36 (m 8H), 0.95 (m 12H).

Synthesis of 4-bromo-2,5-di((2-ethylhexyl)oxy)benzaldehyde (BrEHA) BrEH (1 equiv.) is loaded into a two-neck round bottomed glass flask and vacuum purged with argon three times. Anhydrous tetrahydrofuran is added by syringe (ca. 25 mL solvent/g Br6) and the vessel is placed into a bath of dry ice and 2-propanol (−78° C.). n-Butyllithium (1 equiv.) is added dropwise via syringe and the reaction is stirred at −78° C. for 1 hour. Anhydrous DMF (4 equiv.) is then added and the reaction is allowed to warm to 23° C. over three hours. The reaction is quenched carefully with water and extracted with diethylether. The organic layer is collected and dried over MgSO$_4$ before being filtered and rotovaped to remove solvents. Purification is done by column chromatography with ethylacetate:hexane (1:30) eluent followed by successive recrystallizations from methanol and acetonitrile at 23° C. A colorless liquid is collected at yields of 15%. For Br6A, $^1$H NMR (300 MHz, CDCl$_3$): δ 10.42 (s 1H), 7.33 (s 1H), 7.24 (s 1H), 3.93 (t 4H), 1.77 (m 2H), 1.50 (m 8H), 1.32 (m 8H), 0.94 (m 12H).

Various polymers can be suitable replacements to crystalline host materials for the activation of DHAE-style phosphors. Efficient triplet-generating chromophores such as BrEHA, a member of the BrnA family, can become brightly phosphorescent when embedded into certain glassy polymers. This effect can be strong even if the chromophore is highly non-crystalline. BrEHA is a liquid yet becomes brightly phosphorescent in certain polymers at ambient temperatures. Glassy polymers, well mixed with DHAE-style small molecule chromophores, can prevent vibrational freedom of the chromophore leading to triplet emission that is dominant over non-emissive relaxation. If the polymer constricts the chromophore efficiently, phosphorescent emission is surprisingly strong.

The critical concept to choosing a good polymer host is the idea of entanglement. In order for the two species to mix well, the polymer should have two features: a flexible backbone that is structurally similar to the substitutents of the chromophore, and small pendants that do not shield the backbone from the small molecule. If these two conditions are met, the small molecule's substitutents (e.g., alkoxy as presented here) can entangle with the polymer backbone, which imparts glassy properties to the chromophore and restricts vibration. This effect can be enhanced if the backbone has a more space-filling structure, such as additional methyl substitutents, and if the pendants have any favorable interaction with the small molecule, such as $\pi$-$\pi$ interactions.

By activating the phosphorescence of DHAE phosphors in non-crystalline and disordered systems we have removed one of the strict requirements of the DHAE design principle: perfect crystal order. This widens the design of metal-free organic phosphors even further and opens their use to a wider variety of applications. Also, the many desirable aspects of polymeric systems (process-ability, homogeneity, dope-ability, etc.) are now available to DHAE phosphors. This technology can also be used to make a true polymeric metal-free organic phosphor suitable for the fabrication of optoelectronic and optical biological devices, for example.

Another of way of using the present technology is through an intramolecular directed heavy atom effect. In some embodiments, the organic phosphorescent materials described herein rely on high quality crystal formation. This requirement may limit the practical usefulness of the organic phosphorescent materials in some instances for some device applications. To overcome this issue, the directed heavy atom effect can be formed within a single molecule so that the high quality crystallization requirement can be removed. As various examples, the compounds illustrated in FIG. 17 include the DHAE design principle.

One of the compounds shown in FIG. 17, 8-bromobiphenylene-1-carboxaldehyde, was synthesized and various optical experiments as described herein were performed to confirm the phosphorescence. Unlike the intermolecular DHAE, the phosphorescence of 8-bromobiphenylene-1-carboxaldehyde having an intramolecular DHAE occurred with the pure bromo-aldehyde compound without blending by any matrix or doping chemicals. A solution of this compound dissolved in chloroform gave a red-shifted and strong emission that has been observed characteristically at organic phosphorescence, which means the intramolecular interaction between the halogen (bromine in this case) and aldehyde has the capability of the driving force of phosphorescent emission. The only heavy atom interaction possible in solution is due to the intramolecular DHAE interaction occurring on the same plane of the molecular structure since in a diluted solution molecules are too far apart to interact together and there is no or little chance to be close enough to each other to provide an intermolecular interaction. Moreover, as the temperature became lower, the intensity of emission became stronger and luminescence was much more red-shifted as seen in the PL spectrum of FIG. 18. Stronger emission at lower temperatures is explained by an enhanced interaction between Br and aldehyde due to reduced or freezing of vibrational free movement of atomic orbitals.

The chemical structure of 8-bromobiphenylene-1-carboxaldehyde was characterized by 400 MHz $^1$H-NMR and mass spectrometry, producing the spectra illustrated in FIGS. 17 and 18, respectively. The unique singlet peak of the aldehyde proton was observed over 10 ppm in the NMR spectra and the exact value of molecular weight was detected by measurement using Electron-Ionization Mass Spectrometry.

Based on the 8-bromobiphenylene-1-carboxaldehyde example, modified molecules of biphenylene, various derivatives thereof, and other compounds designed to include an intramolecular DHAE can be formed. Tailoring the structure of a compound providing an intramolecular DHAE may provide tuning of multicolor phosphorescence.

Another way of employing the present technology is in the form of phosphorescent organic nanowires generated by self-assembly. For example, compounds providing a DHAE can be designed to self-assemble into phosphorescent nanowires. Such compounds can include monomers that have an extended conjugation so that the nanowires can be electrically conducting as well. The conducting property together with the phosphorescent character make these new molecules useful for various applications, such as solid state lighting, organic light emitting diodes, and photovoltaic cells. Examples of compounds forming phosphorescent organic nanowires by self-assembly include those shown in FIG. 21, along with photomicrographs of the resulting wires.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions and methods can be made within the scope of the present technology, with substantially similar results.

The following non-limiting discussion of terminology is provided with respect to the present technology.

The headings (such as "Introduction" and "Summary") and sub-headings used herein are intended only for general organization of topics within the present disclosure, and are not intended to limit the disclosure of the technology or any aspect thereof. In particular, subject matter disclosed in the "Introduction" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

As used herein, the words "desire" or "desirable" refer to embodiments of the technology that afford certain benefits, under certain circumstances. However, other embodiments may also be desirable, under the same or other circumstances. Furthermore, the recitation of one or more desired embodiments does not imply that other embodiments are not useful, and is not intended to exclude other embodiments from the scope of the technology.

As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present technology that do not contain those elements or features.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting materials, components or process steps, the present technology also specifically includes embodiments consisting of, or consisting essentially of, such materials, components or processes excluding additional materials, components or processes (for consisting of) and excluding additional materials, components or processes affecting the significant properties of the embodiment (for consisting essentially of), even though such additional materials, components or processes are not explicitly recited in this application. For example, recitation of a composition or process reciting elements A, B and C specifically envisions embodiments consisting of, and consisting essentially of, A, B and C, excluding an element D that may be recited in the art, even though element D is not explicitly described as being excluded herein.

As referred to herein, all compositional percentages are by weight of the total composition, unless otherwise specified. Disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

"A" and "an" as used herein indicate "at least one" of the item is present; a plurality of such items may be present, when possible. "About" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters.

When an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

What is claimed is:

1. A crystalline composition exhibiting metal-independent phosphorescence comprising:
    a first portion comprising a carbonyl group bonded to an aromatic group or an aromatic group having extended π-conjugation;
    a second portion comprising a halogen atom bonded to an aromatic group or an aromatic group having extended π-conjugation; and
    a non-covalent interaction between the oxygen of the carbonyl group and the halogen atom, wherein the distance between the oxygen of the carbonyl group and the halogen atom is less than the van der Waals radii of the oxygen of the carbonyl group and the halogen atom.

2. The composition of claim 1, wherein the composition exhibits a quantum yield from about 1% to about 68%.

3. The composition of claim 1, wherein the distance between the oxygen and the halogen is less than 3.37 A.

4. The composition of claim 1, wherein the carbonyl group is —CHO.

5. The composition of claim 1, further comprising a polymer.

6. The composition of claim 5, wherein the polymer comprises poly(methylacrylate), poly(methylmethacrylate), poly(styrene), or poly(α-methyl styrene).

7. The composition of claim 1, wherein the non-covalent interaction is intermolecular.

8. The composition of claim 1, wherein the composition comprises a compound of formula I:

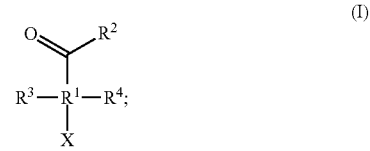

wherein
R¹ is an aromatic group or an aromatic group having extended π-conjugation;
R² is a hydrogen or alkyl group;
R³ and R⁴ are independently hydrogen, alkyl, alkoxy, or alkylsulfane groups optionally substituted with one or more heteroatoms; and
X is a halogen atom.

9. The composition of claim 8, wherein
R¹ is a phenyl or napthyl group;
R² is hydrogen;
R³ and R⁴ are independently hexyl, heptyl, 2-ethylhexyl, methoxy, butyloxy, pentyloxy, hexyloxy, heptyloxy, octyloxy, or hexylsulfane; and
X is a bromine, chlorine, or iodine atom.

10. The composition of claim 9, wherein the compound of formula I comprises 4-bromo-2,5-diheptylbenzaldehyde; 2,5-dihexyloxy-4-bromobenzaldehyde; 4-bromo-2,5-bis(hexylthio)benzaldehyde; 5-bromo-2,6-bis(hexyloxy)-1-naphthaldehyde, or 4-bromo-2,5-di((2-ethylhexyl)oxy)benzaldehyde; 2,5-dimethoxy-4-bromobenzaldehyde; 4-bromo-2,5-dihexylbenzaldehyde; 2,5-dibutyloxy-4-bromobenzaldehyde; 2,5-dipentyloxy-4-bromobenzaldehyde; 2,5-diheptyloxy-4-bromobenzaldehyde; or 2,5-dioctyloxy-4-bromobenzaldehyde.

11. The composition of claim 8, further comprising a compound of formula II:

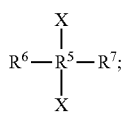

(II)

wherein
R⁵ is an aromatic group or an aromatic group having extended π-conjugation;
R⁶ and R⁷ are independently hydrogen, alkyl, alkoxy, or alkylsulfane groups optionally substituted with one or more heteroatoms; and
X is a halogen atom.

12. The composition of claim 11, wherein
R⁵ is a phenyl or napthyl group;
R⁶ and R⁷ are independently hexyl, heptyl, 2-ethylhexyl, methoxy, butyloxy, pentyloxy, hexyloxy, heptyloxy, octyloxy, or hexylsulfane; and
X is a bromine, chlorine, or iodine atom.

13. The composition of claim 12, wherein
the compound of formula I comprises 4-bromo-2,5-diheptylbenzaldehyde; 2,5-dihexyloxy-4-bromobenzaldehyde; 4-bromo-2,5-bis(hexylthio)benzaldehyde; 5-bromo-2,6-bis(hexyloxy)-1-naphthaldehyde, or 4-bromo-2,5-di((2-ethylhexyl)oxy)benzaldehyde; 2,5-dimethoxy-4-bromobenzaldehyde; 4-bromo-2,5-dihexylbenzaldehyde; 2,5-dibutyloxy-4-bromobenzaldehyde; 2,5-dipentyloxy-4-bromobenzaldehyde; 2,5-diheptyloxy-4-bromobenzaldehyde; or 2,5-dioctyloxy-4-bromobenzaldehyde; and
the compound of formula II comprises 1,4-dibromo-2,5-diheptylbenzene; 2,5-dihexyloxy-1,4-dibromobenzene; (2,5-dibromo-1,4-phenylene)bis(hexylsulfane); 1,5-dibromo-2,6-bis(hexyloxy)naphthalene; 1,4-dibromo-2,5-dimethoxybenzene; 1,4-dibromo-2,5-dihexylbenzene; 2,5-dibutyloxy-1,4-dibromobenzene; 2,5-dipentyloxy-1,4-dibromobenzene; 2,5-diheptyloxy-1,4-dibromobenzene; or 2,5-dioctyloxy-1,4-dibromobenzene.

14. The composition of claim 1, wherein the non-covalent interaction is intramolecular.

15. The composition of claim 14, comprising a compound of formula III:

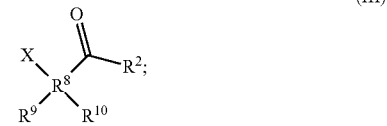

(III)

wherein
R² is a hydrogen or alkyl group;
R⁸ is an aromatic group or an aromatic group having extended π-conjugation;
R⁹ and R¹⁰ are independently hydrogen, alkyl, alkoxy, or alkylsulfane groups optionally substituted with one or more heteroatoms; and
X is a halogen atom.

16. The composition of claim 15, wherein
R² is hydrogen;
R⁸ is a biphenylene, fluorene, 1,2-diphenylethene, or 1,2-distyrylbenzene group;
R⁹ and R¹⁰ are ethyloxy groups; and
X is a bromine, chlorine, or iodine atom.

17. The composition of claim 16, wherein the compound of formula III comprises 8-bromo-3,6-diethoxybiphenylene-1-carbaldehyde; 4,5,8-tribromo-3,6-diethoxybiphenylene-1-carbaldehyde; 5-bromo-2,7-diethoxy-9H-fluorene-4-carbaldehyde; 2-(2-bromo-5-ethoxystyryl)-4-ethoxybenzaldehyde; 2-(2-bromo-4-ethoxystyryl)-5-ethoxybenzaldehyde; or 2-(2-(2-bromostyryl)-4,5-diethoxystyryl)benzaldehyde.

18. An article of manufacture comprising the composition of claim 1, wherein the article of manufacture is a light emitting diode, organic photovoltaic material, flexible lighting display, solid-state lighting, polarized light emitting device, quantum dot, thin-film transistor, or phosphorescent nanowire.

19. A method of providing phosphorescence comprising:
providing a composition according to claim 1; and
exciting the composition with a first light while maintaining the distance between the oxygen of the carbonyl group and the halogen atom at less than the van der Waals radii of the oxygen of the carbonyl group and the halogen atom so that the composition absorbs at least a portion of the first light and emits a second light.

20. The method of claim 19, wherein the distance between the oxygen of the carbonyl group and the halogen atom is maintained at less than the van der Waals radii of the oxygen of the carbonyl group and the halogen atom by crystallizing at least a portion of the composition, entangling the composition with a polymer, or providing the first portion and the second portion in a single compound so that the non-covalent interaction between the carbonyl oxygen and the halogen atom is via an intramolecular directed heavy atom effect.

* * * * *